United States Patent
Futa et al.

(10) Patent No.: US 11,565,637 B2
(45) Date of Patent: Jan. 31, 2023

(54) VEHICLE CONTROL DEVICE AND VEHICLE CONTROL SYSTEM

(71) Applicants: Mazda Motor Corporation, Hiroshima (JP); NXP B.V., Eindhoven (NL)

(72) Inventors: Tomotsugu Futa, Hiroshima (JP); Kiyoyuki Tsuchiyama, Hiroshima (JP); Masato Ishibashi, Hiroshima (JP); Daisuke Hamano, Hiroshima (JP); Daisuke Horigome, Hiroshima (JP); Eiichi Hojin, Hiroshima (JP); Atsushi Tasaki, Hiroshima (JP); Yosuke Hashimoto, Hiroshima (JP); Yusuke Kihara, Hiroshima (JP); Arnaud Van Den Bossche, Munich (DE); Ray Marshal, Glasgow (GB); Leonardo Surico, Munich (DE)

(73) Assignees: MAZDA MOTOR CORPORATION, Hiroshima (JP); NXP B.V., AG Eindhoven (NL)

( * ) Notice: Subject to any disclaimer, the term of this patent is extended or adjusted under 35 U.S.C. 154(b) by 189 days.

(21) Appl. No.: 17/160,426

(22) Filed: Jan. 28, 2021

(65) Prior Publication Data
US 2021/0237666 A1  Aug. 5, 2021

(30) Foreign Application Priority Data
Feb. 5, 2020  (JP) .............................. JP2020-018015

(51) Int. Cl.
*B60R 16/023* (2006.01)
*B60W 30/14* (2006.01)
(Continued)

(52) U.S. Cl.
CPC ....... *B60R 16/0231* (2013.01); *B60W 30/143* (2013.01); *G06V 20/56* (2022.01); *H05K 5/0026* (2013.01); *B60W 2420/42* (2013.01)

(58) Field of Classification Search
CPC ...... G05D 1/0077; G06T 7/20; G06Q 20/203; G01R 21/133; B60T 7/12; H05K 1/117
See application file for complete search history.

(56) References Cited

U.S. PATENT DOCUMENTS

2010/0270929 A1* 10/2010 Frohlich ................ H05K 1/117
315/77
2018/0170374 A1* 6/2018 Otsuka ..................... B60T 7/12
(Continued)

FOREIGN PATENT DOCUMENTS

JP  2017-47694 A  3/2017

OTHER PUBLICATIONS

Peter Els, "The first level-3 automated vehicle is on the road: Is ISO functional safety and analysis in step?", Automotive IQ, total 8 pages. https://www.automotive-iq.com/autonomous-drive/articles/first-level-3-automated-vehicle-road-iso-functional-safety-and-analysis.

(Continued)

*Primary Examiner* — Yuri Kan
(74) *Attorney, Agent, or Firm* — Xsensus LLP

(57) ABSTRACT

A signal processing IC unit performs image processing with respect to an output from a camera. A recognition processing IC unit performs recognition processing based on the output from the signal processing IC unit. A control IC unit outputs a control signal based on the output from the recognition processing IC unit. A first terminal is electrically connected to the recognition processing IC unit. A second terminal is electrically connected to the control IC unit. The signal processing IC unit, the recognition processing IC unit, and (Continued)

the control IC unit are disposed on a board. The first terminal and the second terminal are provided on an edge portion of the board.

3 Claims, 11 Drawing Sheets

(51) Int. Cl.
*H05K 5/00* (2006.01)
*G06V 20/56* (2022.01)

(56) References Cited

U.S. PATENT DOCUMENTS

2018/0321286 A1\* 11/2018 Keister ................ G01R 21/133
2021/0097905 A1\* 4/2021 Garden ................ G06Q 20/203
2021/0224527 A1\* 7/2021 Meador .................... G06T 7/20

OTHER PUBLICATIONS

Texas Instruments, "TDA2Px-ACD CPU EVM Board", User's Guide, SPRUII4A, Dec. 2017, total 8 pages.
Rolf Isermann et al., "Fault-Tolerant Drive-by-Wire Systems", IEEE Control Systems Magazine, Oct. 2002, pp. 64-81.

\* cited by examiner

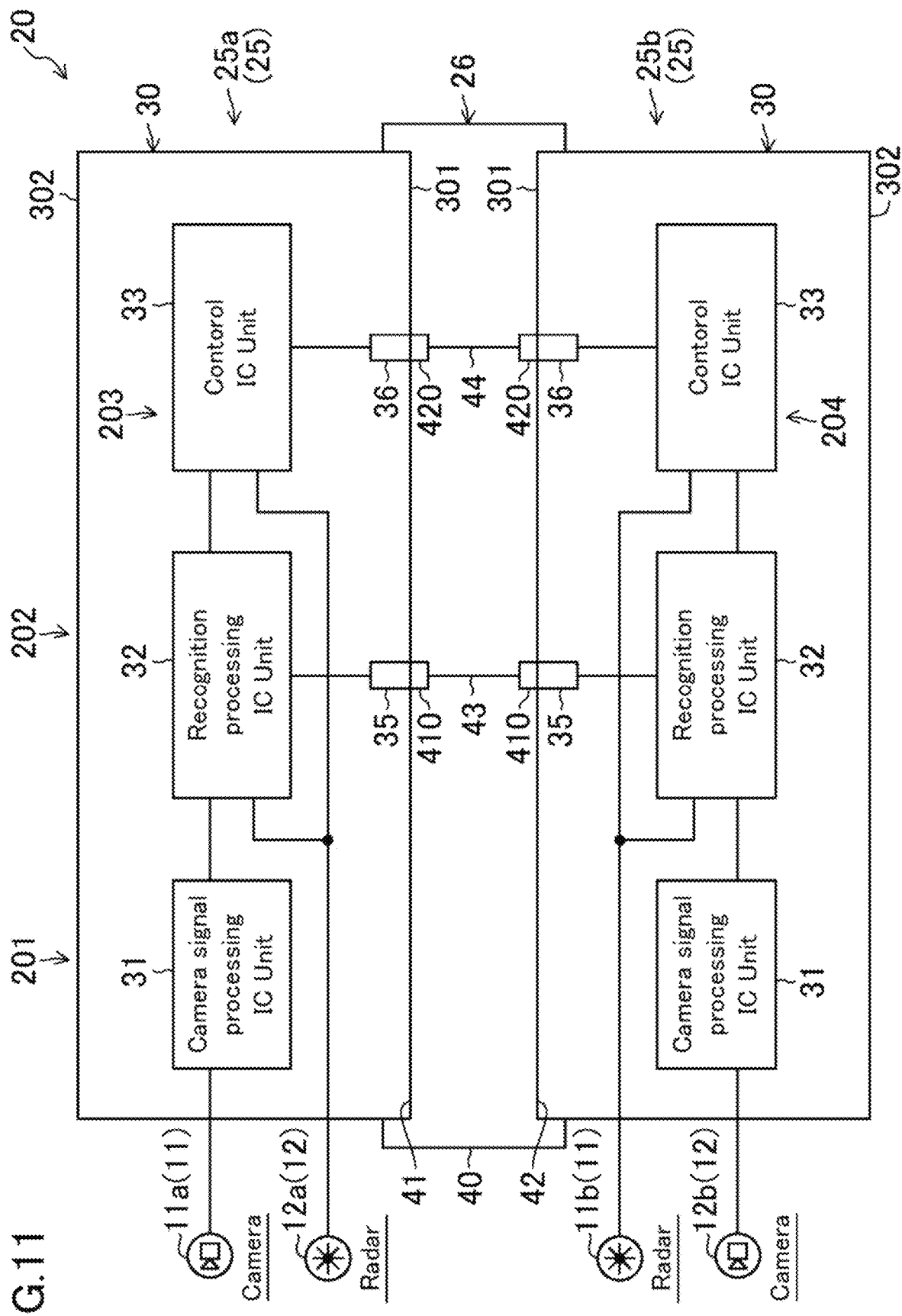

VEHICLE CONTROL DEVICE AND VEHICLE CONTROL SYSTEM

CROSS-REFERENCE TO RELATED APPLICATION

This application claims priority to Japanese Patent Application No. 2020-018015 filed on Feb. 5, 2020, the entire disclosure of which is incorporated by reference herein.

BACKGROUND

The technique disclosed herein relates to a vehicle control device and a vehicle control system.

Japanese Unexamined Patent Publication No. 2017-47694 discloses a vehicle control device. This vehicle control device outputs either a first control signal generated based on self-driving control information or a second control signal generated based on relative information between the vehicle itself and a surrounding object to a drive. This vehicle control device outputs the second control signal in place of the first control signal to the drive when an abnormality is detected in the self-driving control information.

SUMMARY

Considering an automobile product lineup, it is required to develop both a single vehicle control system and a redundant vehicle control system as a vehicle control system. The single vehicle control system is provided with a single processing system (a processing system that performs processing for cruise control of the vehicle). The redundant vehicle control system is provided with a plurality of processing systems in parallel. However, separately developing the single vehicle control system and the redundant vehicle control system increases costs required for the development.

The technique disclosed herein has been made in view of this point, and an object thereof is to reduce costs required for the development.

The technique disclosed herein relates to a vehicle control device for controlling a vehicle. This vehicle control device includes: a board; a signal processing IC unit that performs image processing with respect to an output from a camera provided in the vehicle; a recognition processing IC unit that performs recognition processing for recognizing an external environment of the vehicle based on the output from the signal processing IC unit; a control IC unit that outputs a control signal for cruise control of the vehicle based on the output from the recognition processing IC unit; a first terminal electrically connected to the recognition processing IC unit; and a second terminal electrically connected to the control IC unit. The signal processing IC unit, the recognition processing IC unit, and the control IC unit are disposed on the board. The first terminal and the second terminal are provided on an edge portion of the board.

The above configuration allows a single vehicle control system to be configured from the vehicle control device including the signal processing IC unit, the recognition processing IC unit, and the control IC unit. Alternatively, a redundant vehicle control system may be configured by providing a plurality of vehicle control devices in parallel, electrically connecting first terminals of the respective vehicle control devices to each other, and electrically connecting second terminals of the respective vehicle control devices to each other. As described above, the redundant vehicle control system is constituted by the vehicle control device that can constitutes the single vehicle control system. Thus costs required for development can be reduced compared with the case in which the single vehicle control system and the redundant vehicle control system are separately developed.

The technique disclosed herein further relates to a vehicle control system. This vehicle control system includes a first vehicle control device and a second vehicle control device. Each of the first and second vehicle control devices is the vehicle control device. The first terminal provided on the edge portion of the board of the first vehicle control device is electrically connected to the first terminal provided on the edge portion of the board of the second vehicle control device. The second terminal provided on the edge portion of the board of the first vehicle control device is electrically connected to the second terminal provided on the edge portion of the board of the second vehicle control device.

The above configuration allows the redundant vehicle control system to be configured by providing the first vehicle control device and the second vehicle control device in parallel, electrically connecting between the first terminal of the first vehicle control device and the first terminal of the second vehicle control device, and electrically connecting between the second terminal of the first vehicle control device and the second terminal of the second vehicle control device. This allows costs required for the development to be reduced compared with the case in which the single vehicle control system and the redundant vehicle control system are separately developed.

The vehicle control system may further include a connecting member for connecting the first vehicle control device to the second vehicle control device. The connecting member may include a first connection portion connected to the edge portion of the board of the first vehicle control device, a second connection portion connected to the edge portion of the board of the second vehicle control device, a first wiring for electrically connecting the first terminal which is provided on the edge portion, of the board of the first vehicle control device, connected to the first connection portion to the first terminal which is provided on the edge portion, of the board of the second vehicle control device, connected to the second connection portion, and a second wiring for electrically connecting the second terminal which is provided on the edge portion, of the board of the first vehicle control device, connected to the first connection portion to the second terminal which is provided on the edge portion, of the board of the second vehicle control device, connected to the second connection portion.

The above configuration allows the redundant vehicle control system to be configured by connecting the edge portion of the board of the first vehicle control device and the edge portion of the board of the second vehicle control device to the first connection portion and the second connection portion of the connecting member, respectively. This allows costs required for the development to be reduced compared with the case in which the single vehicle control system and the redundant vehicle control system are separately developed.

BRIEF DESCRIPTION OF THE DRAWINGS

FIG. 11 is a schematic diagram illustrating the configuration of the vehicle control system according to a second variation of the embodiment.

DETAILED DESCRIPTION

Figure 1:
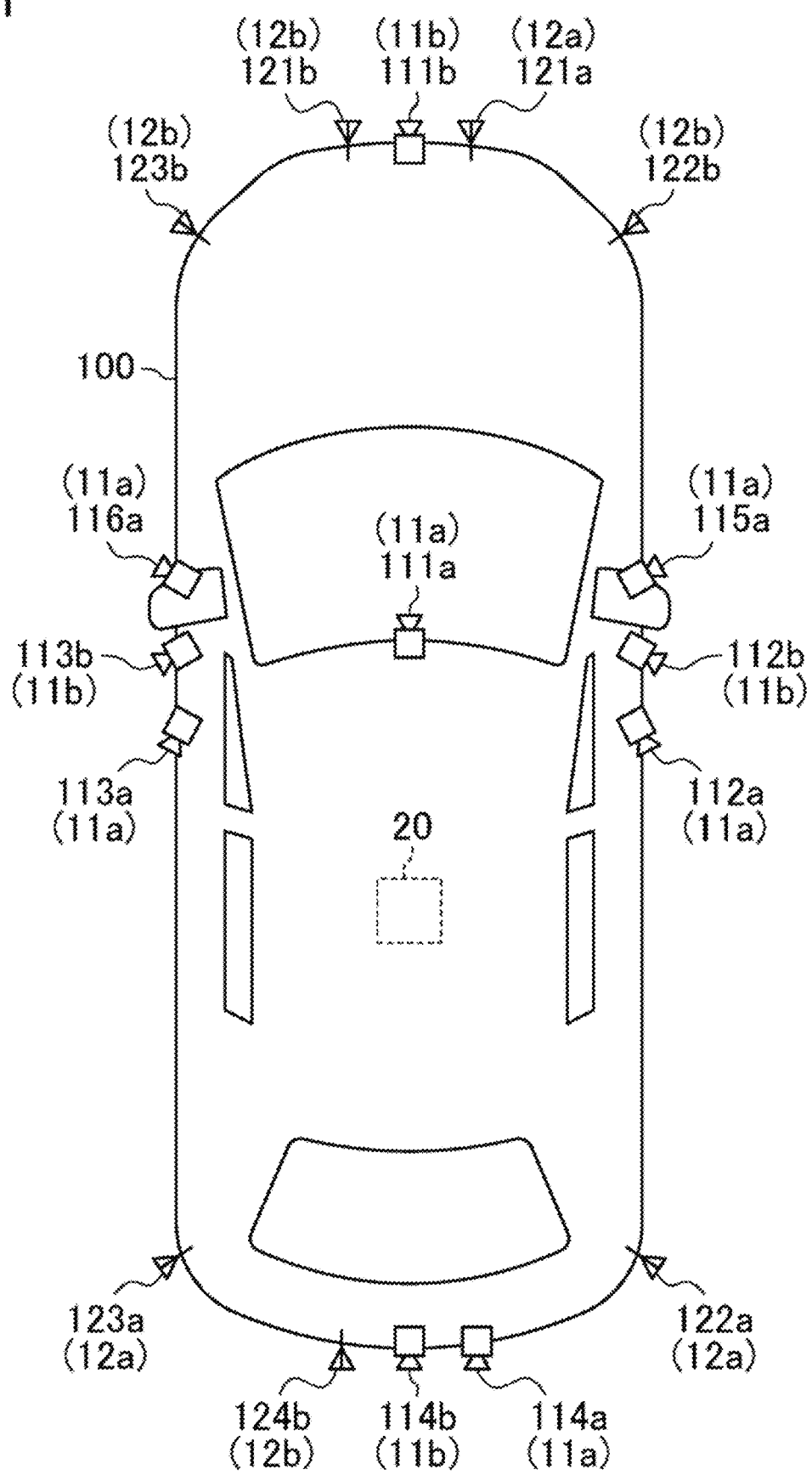
FIG. 1 is a plan view illustrating an appearance of a vehicle including a vehicle control system according to an embodiment.

Embodiments will be described in detail below with reference to the drawings. In the drawings, the same or equivalent parts are denoted by the same reference numerals, and a description thereof is not repeated.

Embodiment

FIG. 1 illustrates an appearance of a vehicle 100 including a vehicle control system 20 according to an embodiment. The vehicle control system 20 is provided in the vehicle 100 (specifically, an four-wheeled vehicle). The vehicle 100 can switch among manual driving, assisted driving, and self-driving. The manual driving is driving to travel in accordance with a driver's operation (e.g., an accelerator operation and the like). The assisted driving is driving to travel with assistance of the driver's operation. The self-driving is driving to travel without the driver's operation. The vehicle control system 20 controls the vehicle 100 during the assisted driving and the self-driving. Specifically, the vehicle control system 20 controls an actuator (not shown) provided in the vehicle 100 to control the motion (specifically, traveling) of the vehicle 100. In the following description, the vehicle 100 provided with the vehicle control system 20 is referred to as "the subject vehicle," whereas another vehicle present around the subject vehicle is referred to as "another vehicle (other vehicles)."

[Actuator]

The actuator provided in the vehicle 100 includes a drive actuator, a steering actuator, a braking actuator, and the like. Examples of the drive actuator include an engine, a motor, and a transmission. Examples of the steering actuator include steering. Examples of the braking actuator include a brake.

[Information Acquisition Unit]

Figure 2:
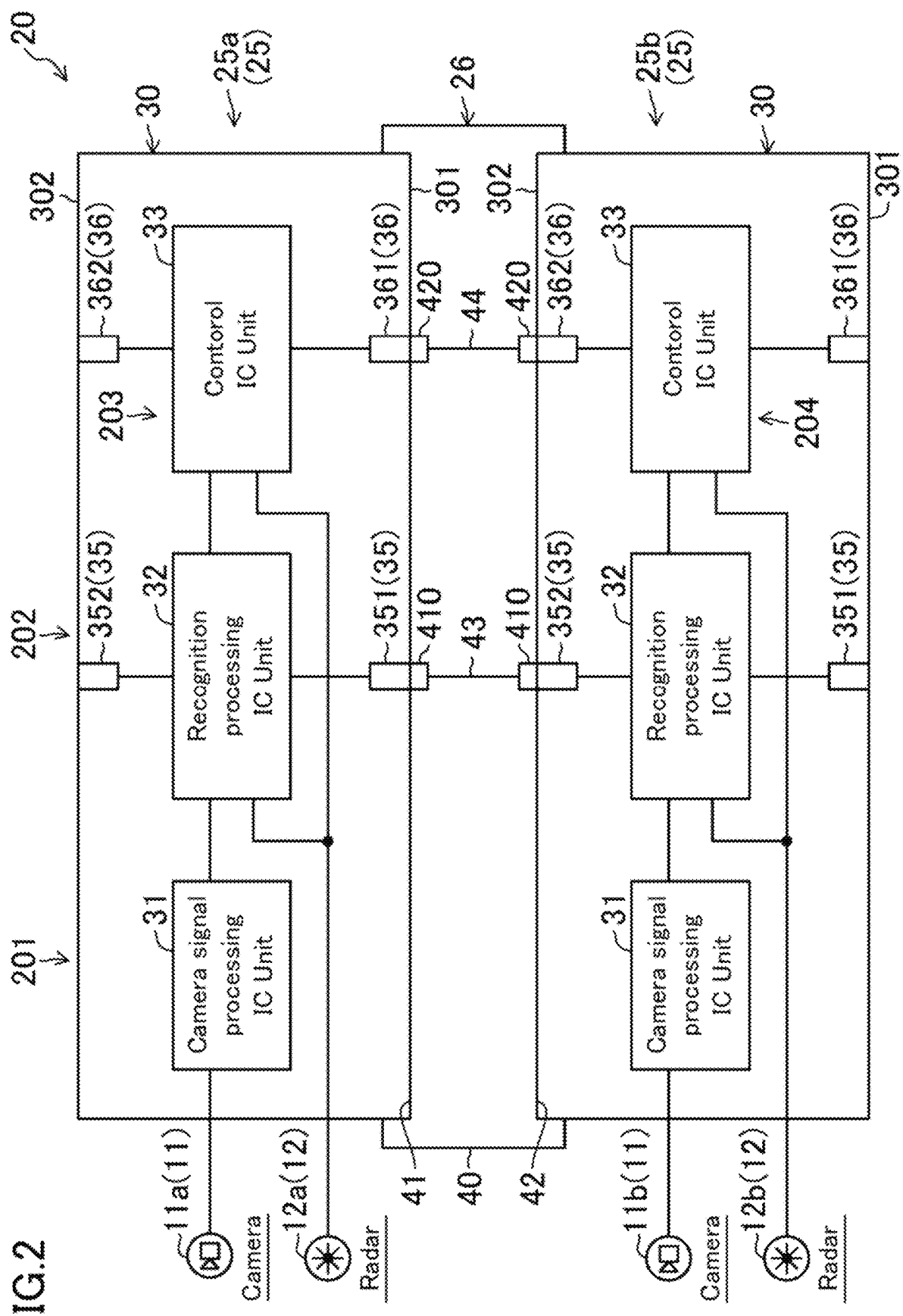
FIG. 2 is a schematic diagram illustrating a configuration of the redundant vehicle control system according to the embodiment.
Figure 5:
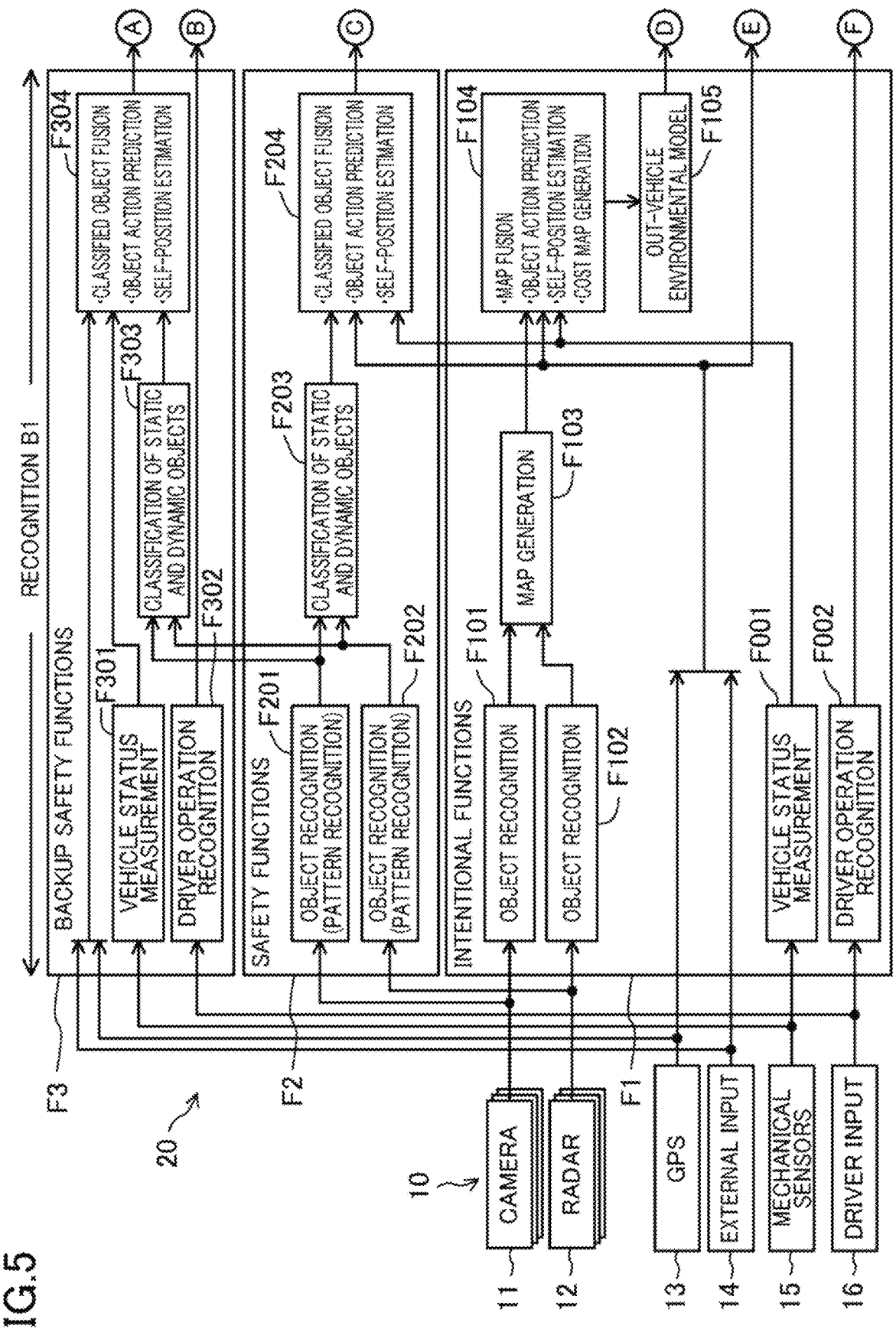
FIG. 5 is a block diagram illustrating a functional configuration of the vehicle control system.

The vehicle 100 is provided with an information acquisition unit 10. The information acquisition unit 10 acquires various kinds of information for use in control (specifically, cruise control) of the vehicle 100. As illustrated in FIGS. 1, 2, and 5, the information acquisition unit 10 includes a plurality of cameras 11, a plurality of radars 12, a position sensor 13, an external input unit 14, mechanical sensors 15, and a driver input unit 16. FIG. 1 and FIG. 2 omit illustration of the position sensor 13, the external input unit 14, the mechanical sensors 15, and the driver input unit 16.

[Camera]

The cameras 11 have the same configuration. The cameras 11 are provided in the vehicle 100 so as to surround the vehicle 100. Each of the cameras 11 images part of an environment spread around the vehicle 100 (an external environment of the vehicle 100) to acquire image data indicating part of the external environment of the vehicle 100. The image data obtained by each of the cameras 11 is transmitted to the vehicle control system 20.

In this example, the cameras 11 are each a monocular camera having a wide-angle lens. The cameras 11 are each constituted by a solid imaging element such as a charge coupled device (CCD) and a complementary metal-oxide-semiconductor (CMOS), for example. The cameras 11 may each be a monocular camera having a narrow-angle lens or a stereo camera having wide-angle lenses or narrow-angle lenses.

The cameras 11 include a plurality of first cameras 11a and a plurality of second cameras 11b. This vehicle 100 has two combinations of the cameras 11 provided in the vehicle 100 so as to surround the vehicle 100.

<First Camera>

The first cameras 11a are provided in the vehicle 100 so as to surround the vehicle 100. Specifically, the first cameras 11a are provided in the vehicle such that imaging areas of the first cameras 11a surround the vehicle 100. In this example, the first cameras 11a include a first front camera 111a, a first diagonally backward right camera 112a, a first diagonally backward left camera 113a, and a first back camera 114a. The first front camera 111a images an area in front of the vehicle 100. The first diagonally backward right camera 112a images an area diagonally backward right of the vehicle 100. The first diagonally backward left camera 113a images an area diagonally backward left of the vehicle 100. The first back camera 114a images an area behind the vehicle 100.

<Second Camera>

The second cameras 11b are provided in the vehicle 100 so as to surround the vehicle 100. Specifically, the second cameras 11b are provided in the vehicle such that imaging areas of the second cameras 11b surround the vehicle 100. In this example, the second cameras 11b include a second front camera 111b, a second diagonally backward right camera 112b, a second diagonally backward left camera 113b, and a second back camera 114b. The second front camera 111b images an area in front of the vehicle 100. The second diagonally backward right camera 112b images an area diagonally backward right of the vehicle 100. The second diagonally backward left camera 113b images an area diagonally backward right of the vehicle 100. The second back camera 114b images an area behind the vehicle 100.

[Radar]

The radars 12 have the same configuration. The radars 12 are provided in the vehicle 100 so as to surround the vehicle 100. Each of the radars 12 detects part of the external environment of the vehicle 100. Specifically, the radars 12 each transmit radio waves toward part of the external environment of the vehicle 100 and receive reflected waves from the part of the external environment of the vehicle 100 to detect the part of the external environment of the vehicle 100. Detection results of the radars 12 are transmitted to the vehicle control system 20.

The radars 12 may each be a millimeter-wave radar that transmits millimeter waves, a lidar (light detection and ranging) that transmits laser light, an infrared radar that transmits infrared rays, or an ultrasonic radar that transmits ultrasonic waves, for example.

The radars 12 include a plurality of first radars 12a and a plurality of second radars 12b. This vehicle 100 has two combinations of the radars 12 provided in the vehicle 100 so as to surround the vehicle 100.

<First Radar>

The first radars 12a are provided in the vehicle 100 so as to surround the vehicle 100. Specifically, the first radars 12a are provided in the vehicle such that detection areas of the first radars 12a surround the vehicle 100. In this example, the first radars 12a include a first front radar 121a, a first diagonally backward right radar 122a, and a first diagonally backward left radar 123a. The first front radar 121a detects the external environment in front of the vehicle 100. The first diagonally backward right radar 122a detects the external environment diagonally backward right of the vehicle 100. The first diagonally backward left radar 123a detects the external environment diagonally backward left of the vehicle 100.

<Second Radar>

The second radars 12b are provided in the vehicle 100 so as to surround the vehicle 100. Specifically, the second radars 12b are provided in the vehicle 100 such that detection areas of the second radars 12b surround the vehicle 100. In this example, the second radars 12b include a second front radar 121b, a second diagonally backward right radar 122b, a second diagonally backward left radar 123b, and a second back radar 124b. The second front radar 121b detects the external environment in front of the vehicle 100. The second diagonally backward right radar 122b detects the external environment diagonally backward right of the vehicle 100. The second diagonally backward left radar 123b detects the external environment diagonally backward left of the vehicle 100. The second back radar 124b detects the external environment behind the vehicle 100.

[Relationship Between Camera and Radar]

In this example, each monitoring area and each arrangement of the first cameras 11a and the first radars 12a are set such that a combination of their monitoring areas surrounds the entire circumference of the vehicle 100. Similarly, each monitoring area and each arrangement of the second cameras 11b and the second radars 12b are set such that a combination of their monitoring areas surrounds the entire circumference of the vehicle 100.

[Position Sensor]

The position sensor 13 detects the position (e.g., the latitude and the longitude) of the vehicle 100. The position sensor 13 receives GPS information from the Global Positioning System and detects the position of the vehicle 100 based on the GPS information, for example. The information (the position of the vehicle 100) obtained by the position sensor 13 is transmitted to the vehicle control system 20.

[External Input Unit]

The external input unit 14 receives information through an extra-vehicle network (e.g., the Internet and the like) provided outside the vehicle 100. The external input unit 14 receives communication information from another vehicle (not shown) positioned around the vehicle 100, car navigation data from a navigation system (not shown), traffic information, high-precision map information, and the like, for example. The information obtained by the external input unit 14 is transmitted to the vehicle control system 20.

[Mechanical Sensor]

The mechanical sensors 15 detect the status (e.g., the speed, the acceleration, the yaw rate, and the like) of the vehicle 100. The mechanical sensors 15 include a vehicle speed sensor that detects the speed of the vehicle 100, an acceleration sensor that detects the acceleration of the vehicle 100, and a yaw rate sensor that detects the yaw rate of the vehicle 100, for example. The information (the status of the vehicle 100) obtained by the mechanical sensors 15 is transmitted to the vehicle control system 20.

[Driver Input Unit]

The driver input unit 16 detects driving operations applied to the vehicle 100. The driver input unit 16 includes an accelerator position sensor, a steering angle sensor, a brake hydraulic pressure sensor, and the like, for example. The accelerator position sensor detects an accelerator operation amount of the vehicle 100. The steering angle sensor detects a steering angle of a steering wheel of the vehicle 100. The brake hydraulic pressure sensor detects a brake operation amount of the vehicle 100. The information (the driving operation of the vehicle 100) obtained by the driver input unit 16 is transmitted to the vehicle control system 20.

[Redundant Vehicle Control System]

Figure 3:
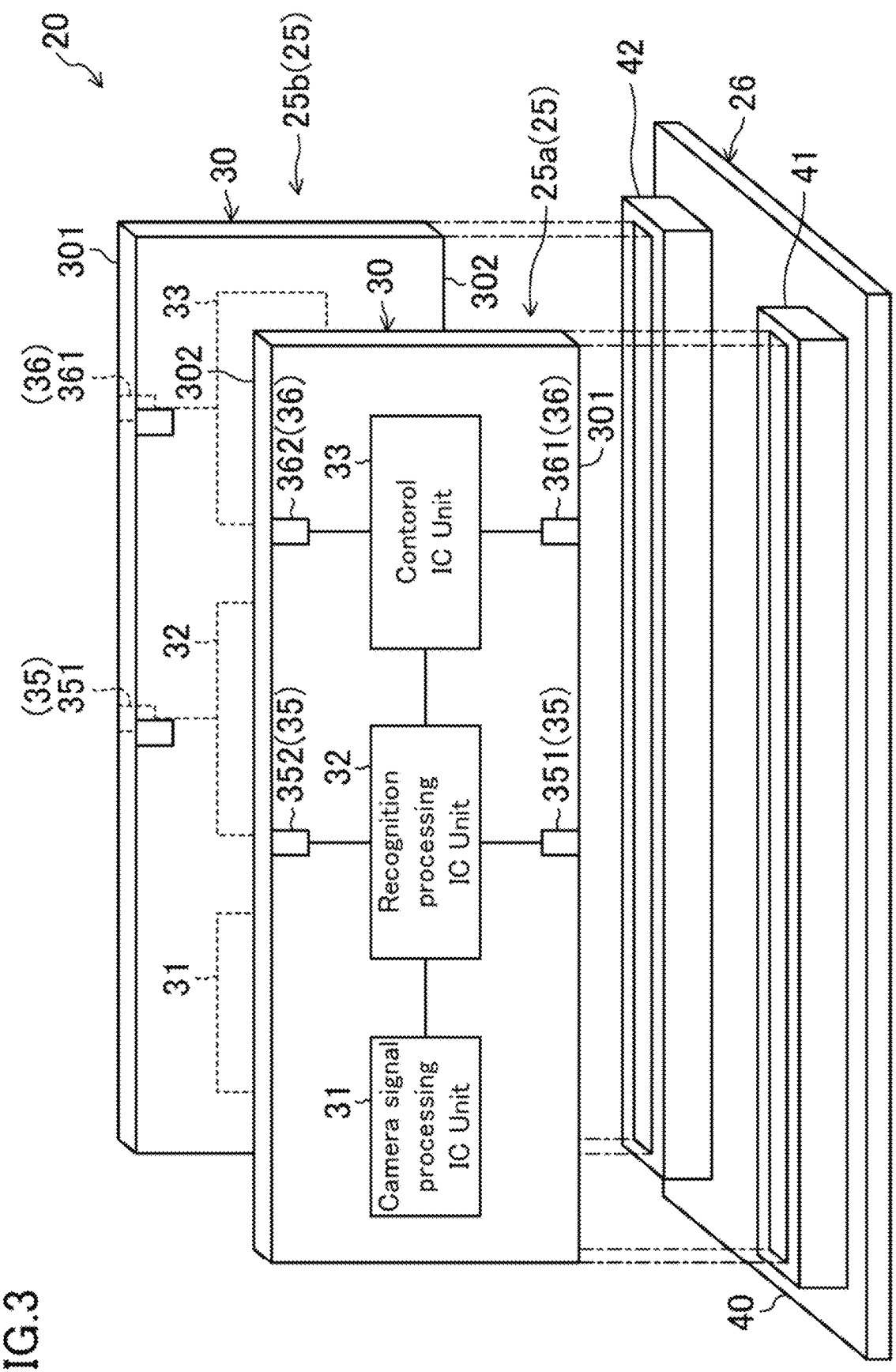
FIG. 3 is a perspective view illustrating the configuration of the vehicle control system according to the embodiment.
Figure 4:
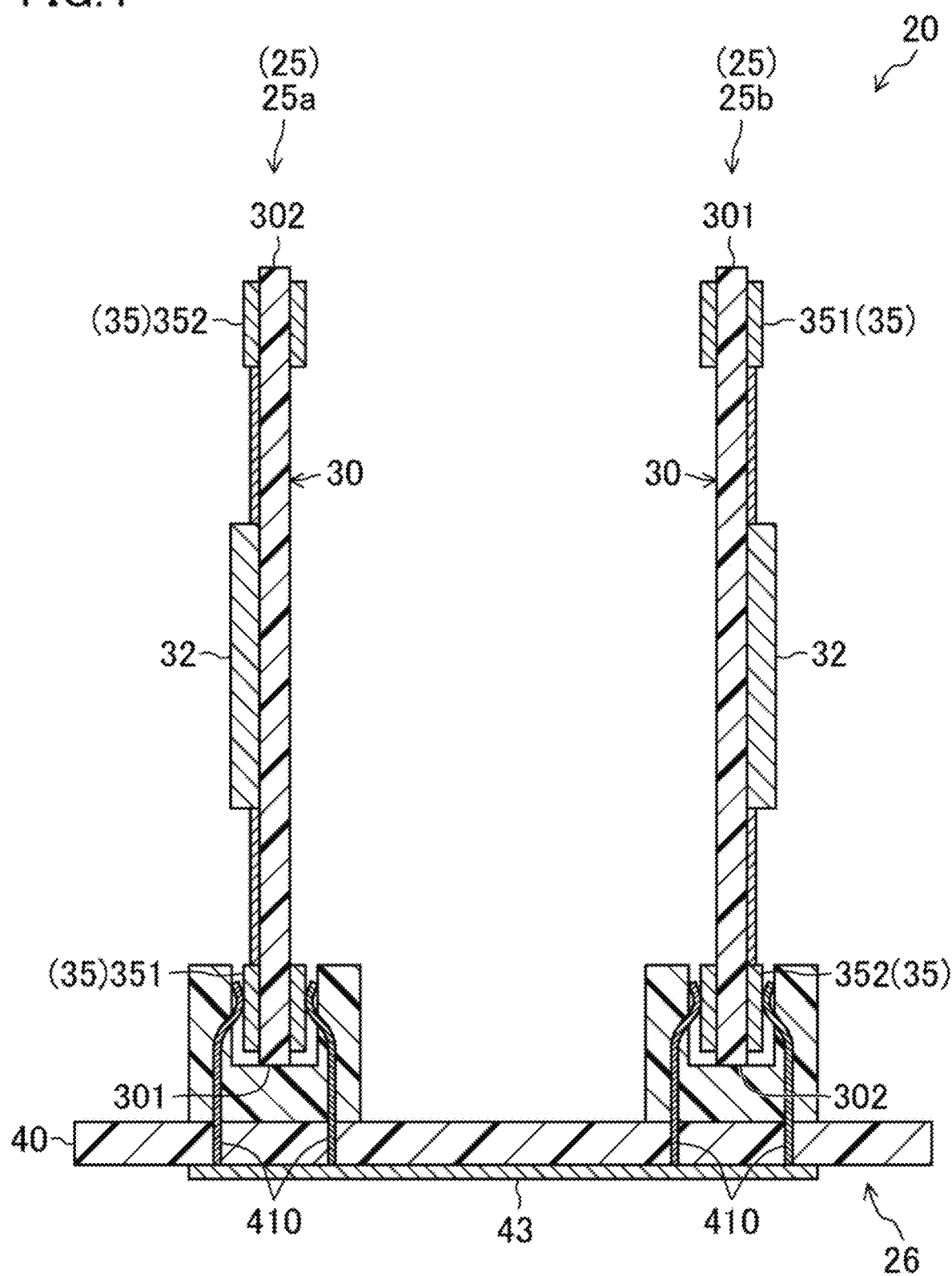
FIG. 4 is a cross-sectional view illustrating the configuration of the vehicle control system according to the embodiment.

FIGS. 2, 3, and 4 illustrate a configuration of the vehicle control system 20. The vehicle control system 20 is housed in a single housing installed in a specific position within the vehicle 100 such as a lower part of a passenger's seat or a trunk, for example. This vehicle control system 20 is a redundant vehicle control system. The redundant vehicle control system is provided with a plurality of processing systems (systems that perform processing for cruise control of the vehicle 100). Specifically, this vehicle control system 20 includes a first vehicle control device 25a, a second vehicle control device 25b, and a connecting member 26. Each of the first vehicle control device 25a and the second vehicle control device 25b is a vehicle control device 25.

[Vehicle Control Device]

The vehicle control device 25 includes a board 30, a signal processing integrated circuit (IC) unit 31, a recognition processing IC unit 32, a control IC unit 33, a first terminal 35, and a second terminal 36.

<Board>

The board 30 is formed from an insulating material and is formed in a rectangular plate shape.

<IC Unit>

The signal processing IC unit 31, the recognition processing IC unit 32, and the control IC unit 33 are disposed on the board 30 (specifically, a circuit formation face of the board 30). Each of these IC units may include a single integrated circuit (IC) or a plurality of ICs. The IC may house a single core or die or house a plurality of cores or dies cooperating with each other. The core or die may include a CPU (processor) and a memory storing therein a program for operating the CPU and information such as processing results by the CPU, for example.

<Signal Processing IC Unit>

The signal processing IC unit 31 performs image processing with respect to an output from the cameras 11 provided in the vehicle 100. The signal processing IC unit 31 then outputs image data obtained by the image processing.

<Recognition Processing IC Unit>

The recognition processing IC unit 32 performs recognition processing based on the output from the signal processing IC unit 31. The recognition processing is processing for recognizing the external environment of the vehicle 100. The recognition processing IC unit 32 then outputs external environment data obtained by the recognition processing.

<Control IC Unit>

The control IC unit 33 outputs a control signal based on the output from the recognition processing IC unit 32. The control signal is a signal for cruise control of the vehicle. Specifically, the control IC unit 33 performs determination processing for cruise control of the vehicle 100 based on the output (the external environment data) from the recognition processing IC unit 32. The control IC unit 33 outputs the control signal based on a result of the determination processing.

<First Terminal>

The first terminal 35 is provided on an edge portion of the board 30. The first terminal 35 is electrically connected to the recognition processing IC unit 32. In this example, the first terminal 35 is electrically connected to the recognition processing IC unit 32 with a wiring part (a conductive layer) provided on the circuit formation face of the board 30.

In this example, the first terminal 35 includes a first input terminal 351 and a first output terminal 352. The first input terminal 351 is provided on a first edge portion 301 of the board 30. The first input terminal 351 is electrically connected to an input unit of the recognition processing IC unit 32. The first output terminal 352 is provided on a second edge portion 302 of the board 30. The second edge portion 302 is an edge portion different from the first edge portion 301. In this example, the second edge portion 302 is an edge portion facing the first edge portion 301 in a short-side direction of the board 30. The first output terminal 352 is electrically connected to an output unit of the recognition processing IC unit 32. The first input terminal 351 and the first output terminal 352 are arranged to be linearly symmetrical about a center line between the first edge portion 301 and the second edge portion 302 of the board 30.

<Second Terminal>

The second terminal 36 is provided on the edge portion of the board 30. The second terminal 36 is electrically connected to the control IC unit 33. In this example, the second terminal 36 is electrically connected to the control IC unit 33 with the wiring part (the conductive layer) provided on the circuit formation face of the board 30.

In this example, the second terminal 36 includes a second input terminal 361 and a second output terminal 362. The second input terminal 361 is provided on the first edge portion 301 of the board 30. The second input terminal 361 is electrically connected to an input unit of the control IC unit 33. The second output terminal 362 is provided on the second edge portion 302 of the board 30. The second output terminal 362 is electrically connected to an output unit of the control IC unit 33. The second input terminal 361 and the second output terminal 362 are arranged to be linearly symmetrical about the center line between the first edge portion 301 and the second edge portion 302 of the board 30.

[Connecting Member]

The connecting member 26 has a connection board 40, a first connection portion 41, a second connection portion 42, a first wiring 43, and a second wiring 44.

<Connection Board>

The connection board 40 is formed from an insulating material and is formed into a rectangular plate shape.

<Connection Portion>

The edge portion of the board 30 in the first vehicle control device 25a (the first edge portion 301 in this example) is connected to the first connection portion 41. The edge portion of the board 30 of the second vehicle control device 25b (the second edge portion 302 in this example) is connected to the second connection portion 42. Specifically, the first connection portion 41 and the second connection portion 42 protrude on one face (a principal face) of the connection board 40. Each of the first connection portion 41 and the second connection portion 42 is provided with a groove (slot), and the edge portion of the board 30 in the vehicle control device 25 (the first edge portion 301 or the second edge portion 302 in this example) is inserted into the groove. In this example, the first connection portion 41 and the second connection portion 42 are integral with the connection board 40.

<Connection Electrode>

In this example, the first connection portion 41 and the second connection portion 42 are provided with a first connection electrode 410 and a second connection electrode 420, respectively.

The first connection electrode 410 of the first connection portion 41 comes into contact with the first terminal 35 provided on the edge portion of the board 30 in the first vehicle control device 25a connected to the first connection portion 41, thereby electrically connected to the first terminal 35. The first connection electrode 410 of the second connection portion 42 comes into contact with the first terminal 35 provided on the edge portion of the board 30 in the second vehicle control device 25b connected to the second connection portion 42, thereby electrically connected to the first terminal 35.

The second connection electrode 420 of the first connection portion 41 comes into contact with the second terminal 36 provided on the edge portion of the board 30 in the first vehicle control device 25a connected to the first connection portion 41, thereby electrically connected to the second terminal 36. The second connection electrode 420 of the second connection portion 42 comes into contact with the second terminal 36 provided on the edge portion of the board 30 in the second vehicle control device 25b connected to the second connection portion 42, thereby electrically connected to the second terminal 36.

Specifically, in this example, when the first edge portion 301 of the board 30 in the first vehicle control device 25a is connected to the first connection portion 41, the first connection electrode 410 of the first connection portion 41 comes into contact with the first input terminal 351 provided on the first edge portion 301 of the board 30 in the first vehicle control device 25a. The second connection electrode 420 of the first connection portion 41 comes into contact with the second input terminal 361 provided on the first edge portion 301 of the board 30 in the first vehicle control device 25a. When the second edge portion 302 of the board 30 in the second vehicle control device 25b is connected to the second connection portion 42, the first connection electrode 410 of the second connection portion 42 comes into contact with the first output terminal 352 provided on the second edge portion 302 of the board 30 of the second vehicle control device 25b. The second connection electrode 420 of the second connection portion 42 comes into contact with the second output terminal 362 provided on the second edge portion 302 of the board 30 of the second vehicle control device 25b.

<First Wiring>

The first wiring 43 electrically connects between the first terminal 35 provided on the edge portion of the board 30 in the first vehicle control device 25a connected to the first connection portion 41, and the first terminal 35 provided on the edge portion of the board 30 of the second vehicle control device 25b connected to the second connection portion 42.

In this example, the first wiring 43 is provided on the other face (the back face) of the connection board 40. The first wiring 43 electrically connects between the first connection electrode 410 of the first connection portion 41, and the first connection electrode 410 of the second connection portion 42.

<Second Wiring>

The second wiring 44 electrically connects between the second terminal 36 provided on the edge portion of the board 30 in the first vehicle control device 25a connected to the first connection portion 41, and the second terminal 36 provided on the edge portion of the board 30 of the second vehicle control device 25b connected to the second connection portion 42.

In this example, the second wiring 44 is provided on the other face (the back face) of the connection board 40. The second wiring 44 electrically connects between the second connection electrode 420 of the first connection portion 41, and the second connection electrode 420 of the second connection portion 42.

[Connection Between First Vehicle Control Device and Second Vehicle Control Device]

In this example, when the first edge portion 301 of the board 30 in the first vehicle control device 25a is connected to the first connection portion 41 of the connecting member 26, the first connection electrode 410 of the first connection portion 41 and the first input terminal 351 of the first vehicle control device 25a come into contact with each other, while the second connection electrode 420 of the first connection portion 41 and the second input terminal 361 of the first vehicle control device 25a come into contact with each other. Thus, the first input terminal 351 of the first vehicle control device 25a is electrically connected to one end portion of the first wiring 43 via the first connection electrode 410 of the first connection portion 41, while the second input terminal 361 of the first vehicle control device 25a is electrically connected to one end portion of the second wiring 44 via the second connection electrode 420 of the first connection portion 41.

When the second edge portion 302 of the board 30 in the second vehicle control device 25b is connected to the second connection portion 42 of the connecting member 26, the first connection electrode 410 of the second connection portion 42 and the first output terminal 352 of the second vehicle control device 25b come into contact with each other, while the second connection electrode 420 of the second connection portion 42 and the second output terminal 362 of the second vehicle control device 25b come into contact with each other. Thus, the second input terminal 361 of the second vehicle control device 25b is electrically connected to the other end portion of the first wiring 43 via the first connection electrode 410 of the second connection portion 42, while the second output terminal 362 of the second vehicle control device 25b is electrically connected to the other end portion of the second wiring 44 via the second connection electrode 420 of the second connection portion 42.

Thus, in this example, the first input terminal 351 provided on the first edge portion 301 of the board 30 in the first vehicle control device 25a is electrically connected to the first output terminal 352 provided on the second edge portion 302 of the board 30 in the second vehicle control device 25b. The second input terminal 361 provided on the first edge portion 301 of the board 30 in the first vehicle control device 25a is electrically connected to the second output terminal 362 provided on the second edge portion 302 of the board 30 in the second vehicle control device 25b.

[Function of Vehicle Control System]

In the vehicle control system 20 illustrated in FIG. 2, the signal processing IC unit 31 of the first vehicle control device 25a and the signal processing IC unit 31 of the second vehicle control device 25b constitute a signal processing unit 201. The recognition processing IC unit 32 of the first vehicle control device 25a and the recognition processing IC unit 32 of the second vehicle control device 25b constitute a recognition processing unit 202. The control IC unit 33 of the first vehicle control device 25a constitutes a determination processing unit 203. The control IC unit 33 of the second vehicle control device 25b constitutes a backup processing unit 204.

<Signal Processing Unit>

The signal processing unit 201 performs image processing with respect to the output from the cameras 11. The signal processing unit 201 outputs image data obtained by the image processing.

<Recognition Processing Unit>

The recognition processing unit 202 performs recognition processing for recognizing the external environment of the vehicle 100 based on the output (the image data) from the signal processing unit 201. The recognition processing unit 202 outputs external environment data obtained by the recognition processing.

<Determination Processing Unit>

The determination processing unit 203 performs determination processing for cruise control of the vehicle 100 based on the output (the external environment data) from the recognition processing unit 202. The determination processing unit 203 then outputs a control signal for cruise control of the vehicle 100 based on a result of the determination processing.

<Backup Processing Unit>

The backup processing unit 204 performs recognition processing for recognizing the external environment of the vehicle 100 based on the output (the image data) from the signal processing unit 201. The backup processing unit 204 performs determination processing for cruise control of the vehicle 100 based on a result of the recognition processing. The backup processing unit 204 then outputs a control signal for cruise control of the vehicle 100 based on the result of the determination processing.

[Details of Function of Vehicle Control System]

Figure 6:
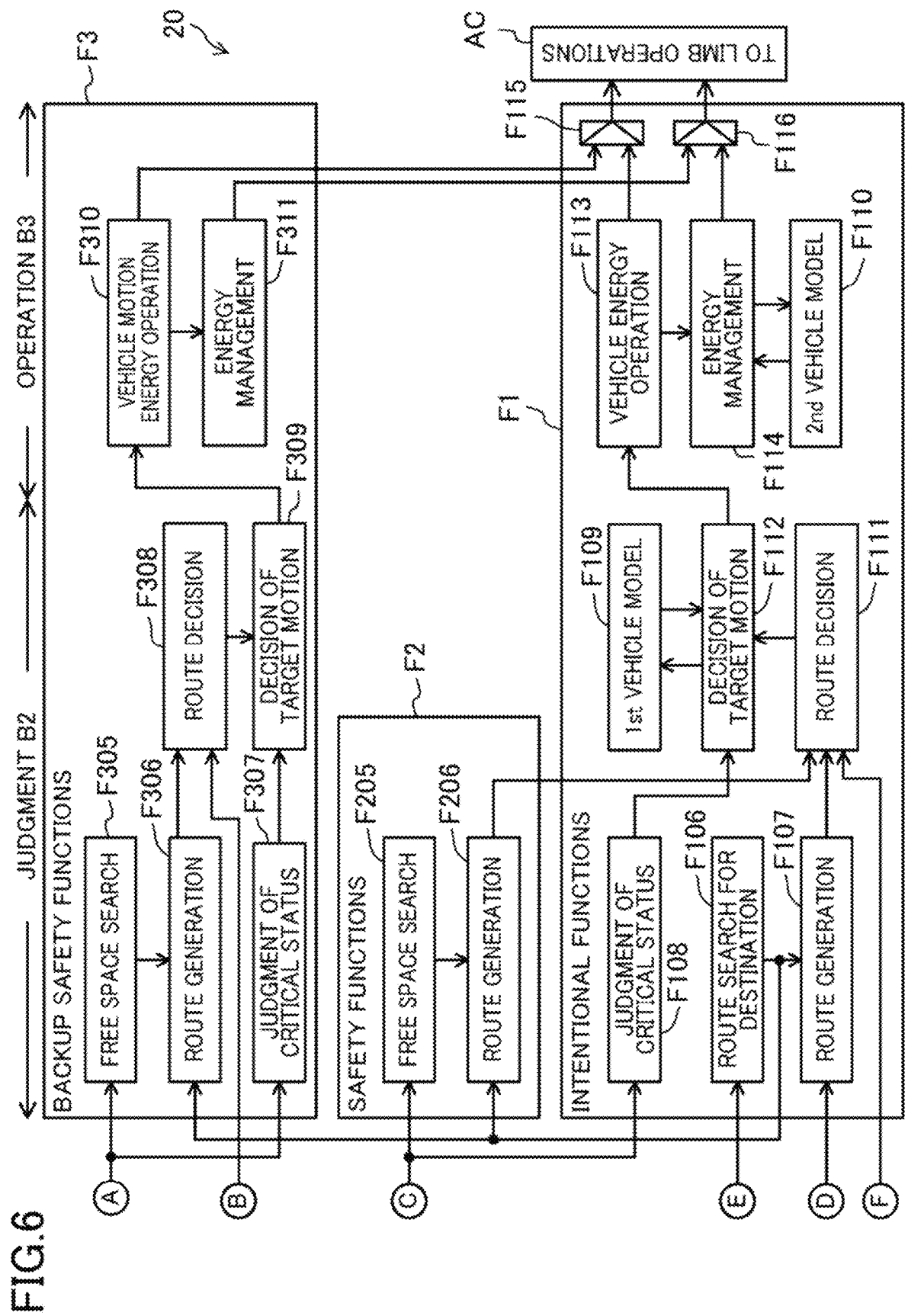
FIG. 6 is a block diagram illustrating the functional configuration of the vehicle control system.

The following describes a functional configuration of the vehicle control system 20 with reference to FIGS. 5 and 6. The function of the vehicle control system 20 is broadly divided into a recognition block B1, a determination block B2, and an operation block B3. The recognition block B1 recognizes the external environment of the vehicle 100 based on the various kinds of information acquired by the information acquisition unit 10. The recognition block B1 may be configured to recognize an internal environment of the vehicle 100. The determination block B2 determines a status and condition of the vehicle 100 based on a recognition result of the recognition block B1 and determines a target operation of the vehicle 100 based on a result of the determination. The operation block B3 generates a signal for controlling the actuator AC provided in the vehicle 100 based on the target operation of the vehicle 100 determined by the determination block B2 and outputs the signal to the actuator AC.

In this example, the vehicle control system 20 includes a main arithmetic unit F1, a safety functional unit F2, and a backup functional unit F3.

<Main Arithmetic Unit>

The main arithmetic unit F1 recognizes the external environment of the vehicle 100 based on the output from the information acquisition unit 10 and determines a target route of the vehicle 100 based on the external environment of the vehicle 100. The main arithmetic unit F1 determines a target motion of the vehicle 100 based on the target route of the vehicle 100 and outputs a control signal based on the target motion of the vehicle 100. For the processing by the main arithmetic unit F1, a learning model generated by deep learning is used. In the deep learning, a multilayered neural network (deep neural network) is used. Examples of the multilayered neural network include Convolutional Neural Network (CNN).

In this example, the main arithmetic unit F1 includes a vehicle status detection unit F001, a driver operation recognition unit F002, an object recognition unit F101 (an image system), an object recognition unit F102 (a radar system), a map generation unit F103, an external environment estimation unit F104, an external environment model F105, a route search unit F106, a route generation unit F107, a critical status determination unit F108, a first vehicle model F109, a second vehicle model F110, a route determination unit F111, a target motion determination unit F112, a vehicle motion energy setting unit F113, an energy management unit F114, a selector F115, and a selector F116.

The vehicle status detection unit F001, the driver operation recognition unit F002, the object recognition unit F101, the object recognition unit F102, the map generation unit F103, the external environment estimation unit F104, and the external environment model F105 belong to the recognition block B1. The route search unit F106, the route generation unit F107, the critical status determination unit F108, the first vehicle model F109, the route determination unit F111, and the target motion determination unit F112 belong to the determination block B2. The second vehicle model F110, the vehicle motion energy setting unit F113, the energy management unit F114, the selector F115, and the selector F116 belong to the operation block B3.

In this example, the signal processing unit 201 includes part of the object recognition unit F101 (the image system), while the recognition processing unit 202 includes the rest thereof. The recognition processing unit 202 includes the object recognition unit F102 (the radar system) and the map generation unit F103. The recognition processing unit 202 (specifically, the recognition processing IC unit 32 of the first vehicle control device 25a) includes the external environment estimation unit F104, the external environment model F105, the route search unit F106, the route generation unit F107, the first vehicle model F109, and the second vehicle model F110. The determination processing unit 203 (specifically, the control IC unit 33 of the first vehicle control device 25a) includes the vehicle status detection unit F001, the driver operation recognition unit F002, the critical status determination unit F108, the route determination unit F111, the target motion determination unit F112, the vehicle motion energy setting unit F113, the energy management unit F114, the selector F115, and the selector F116.

<<Vehicle Status Detection Unit>>

The vehicle status detection unit F001 recognizes the status of the vehicle 100 (e.g., speed, acceleration, yaw rate, and the like) based on the output from the mechanical sensors 15.

<<Driver Operation Recognition Unit>>

The driver operation recognition unit F002 recognizes the driving operations applied to the vehicle 100 based on the output from the driver input unit 16.

<<Object Recognition Unit (Image System)>>

The object recognition unit F101 recognizes an object included in the external environment of the vehicle 100 based on the output from the cameras 11. Thus, information on the object (object information) is obtained. The object information indicates the type of the object the shape of the object, and the like, for example. Examples of the object include a dynamic object that moves with the lapse of time and a stationary object that does not move with the lapse of time. Examples of the dynamic object include four-wheeled vehicles, motorcycles, bicycles, pedestrians, and the like. Examples of the stationary object include signs, roadside trees, median strips, center poles, buildings, and the like.

Specifically, the object recognition unit F101 includes an image processing unit and an image recognition unit. The image processing unit performs image processing with respect to the image data which is the output from the cameras 11. This image processing includes distortion correction processing for correcting the distortion of an image presented in the image data, white balance adjustment processing for adjusting the brightness of the image presented in the image data, and the like. The image recognition unit recognizes the object included in the external environment of the vehicle 100 based on the image data processed by the image processing unit. For object recognition processing by the image recognition unit of the object recognition unit F101, a known object recognition technique (an image data-based object recognition technique) may be used, for example. The image recognition unit of the object recognition unit F101 may be configured to perform the object recognition processing using a learning model generated by deep learning.

In this example, the image processing unit of the object recognition unit F101 includes a first image processing unit that performs processing based on an output from the first camera 11a and a second image processing unit that performs processing based on an output from the second camera 11b. The image recognition unit of the object recognition unit F101 includes a first image recognition unit that performs processing based on an output from the first image processing unit and a second image recognition unit that performs processing based on an output from the second image processing unit. In this example, the signal processing unit 201 includes the image processing unit of the object recognition unit F101, while the recognition processing unit 202 includes the image recognition unit of the object recognition unit F101. Specifically, the signal processing IC unit 31 of the first vehicle control device 25a includes the first image processing unit, while the signal processing IC unit 31 of the second vehicle control device 25b includes the second image processing unit. The recognition processing IC unit 32 of the first vehicle control device 25a includes the first image recognition unit, while the recognition processing IC unit 32 of the second vehicle control device 25b includes the second image recognition unit.

<<Object Recognition Unit (Radar System)>>

The object recognition unit F102 recognizes the object included in the external environment of the vehicle 100 based on a detection result which is the output from the radars 12 (e.g., a peak list of the reflected waves). Thus, the object information is obtained. Specifically, the object recognition unit F102 performs analysis processing (processing for obtaining the object information) with respect to the detection result of the radars 12. For the object recognition processing by the object recognition unit F102, a known object recognition technique (an object recognition technique based on the detection result of the radars 12) may be used, for example. The object recognition unit F102 may be configured to perform the object recognition processing using a learning model generated by deep learning.

In this example, the object recognition unit F102 includes a first radar recognition unit that performs processing based on an output from the first radar 12a and a second radar recognition unit that performs processing based on an output from the second radar 12b. In this example, the recognition processing IC unit 32 of the first vehicle control device 25a includes the first radar recognition unit, while the recognition processing IC unit 32 of the second vehicle control device 25b includes the second radar recognition unit.

<<Map Generation Unit>>

The map generation unit F103 generates map data (e.g., three-dimensional map data) indicating the external environment of the vehicle 100 based on an output from the object recognition unit F101 (image system) and an output from the object recognition unit F102 (radar system). The map generation unit F103 generates the map data for each of a plurality of areas (e.g., four areas of front, rear, right, and left) obtained by dividing a surrounding area surrounding the vehicle 100, for example. In response to the input of the object information obtained by each of the object recognition unit F101 (the image system) and the object recognition unit F102 (the radar system) to the map generation unit F103, the map generation unit F103 fuses the pieces of object information, and reflects the object information obtained by the fusion in the map data.

In this example, the map generation unit F103 includes a first map generation unit that performs processing based on an output from the first image recognition unit of the object recognition unit F101 and an output from the first radar recognition unit of the object recognition unit F102 and a second map generation unit that performs processing based on an output from the second image recognition unit of the object recognition unit F101 and an output from the second radar recognition unit of the object recognition unit F102. In this example, the recognition processing IC unit 32 of the first vehicle control device 25a includes the first map generation unit, while the recognition processing IC unit 32 of the second vehicle control device 25b includes the second map generation unit.

<<External Environment Estimation Unit>>

The external environment estimation unit F104 estimates the external environment of the vehicle 100 based on an output from the vehicle status detection unit F001, an output from the map generation unit F103, an output from the position sensor 13, and an output from the external input unit 14 (e.g., high-precision map information). Specifically, the external environment estimation unit F104 generates the three-dimensional map data indicating the external environment of the vehicle 100 by image recognition processing based on the external environment model F105.

In this example, the external environment estimation unit F104 performs the following operation. First, the external environment estimation unit F104 fuses map data for each of a plurality of areas (e.g., four areas of front, rear, right, and left) to generate fused map data indicating the surroundings (the external environment) of the vehicle 100. Next, for each of dynamic objects included in the fused map data, the external environment estimation unit F104 predicts changes in the distance, direction, and relative speed between the dynamic object and the subject vehicle. The external environment estimation unit F104 then incorporates a result of the prediction into the external environment model F105. Further, the external environment estimation unit F104 estimates the position of the subject vehicle in the fused map data and calculates a route cost based on the output from the position sensor 13 (the position of the vehicle 100), the output from the external input unit 14 (the high-precision map information), and the output from the vehicle status detection unit F001 (e.g., vehicle speed information, six degrees of freedom (6 DoF) information, and the like). The external environment estimation unit F104 incorporates a result of the estimation and a result of the calculation together with information on the subject vehicle acquired by various kinds of sensors into the external environment model F105. With the foregoing processing, the external environment model F105 is updated at any time.

<<External Environment Model>>

The external environment model F105 indicates the external environment of the vehicle 100. The external environment model F105 is a learning model generated by deep learning.

<<Route Search Unit>>

The route search unit F106 searches for a wide-area route of the vehicle 100 based on the output from the position sensor 13 and the output from the external input unit 14 (e.g., car navigation data).

<<Route Generation Unit>>

The route generation unit F107 generates a travel route of the vehicle 100 based on an output from the external environment model F105 and an output from the route search unit F106. To the travel route generated by the route generation unit F107, a score of the safety, the fuel consumption, or the like of the vehicle 100 in the travel route is added, for example. Higher safety of the vehicle 100 in the travel route gives a lower score of the travel route. Lower fuel consumption of the vehicle 100 in the travel route gives a lower score of the travel route. The route generation unit F107 generates at least one travel route giving a relatively low (e.g., the lowest) score.

The route generation unit F107 may generate a plurality of travel routes based on a plurality of viewpoints. The route generation unit F107 may be configured to receive the output from the driver input unit 16 and adjust the travel route in accordance with the output from the driver input unit 16, for example. Thus, a travel route with a relatively low score and a travel route adjusted in accordance with the output from the driver input unit 16 are generated, for example.

<<Critical Status Determination Unit>>

The critical status determination unit F108 determines whether the vehicle 100 is in a critical status based on an output from a preprocessing unit F204 of the safety functional unit F2 (the position of the subject vehicle relative to the object included in the external environment of the vehicle 100). Examples of the critical status of the vehicle 100 include a status in which vehicle 100 may collide with the object, a status in which the vehicle 100 may go out of a lane, and the like. The critical status determination unit F108 may determine whether the vehicle 100 is in the critical status based on the external environment model F105. When determining that the vehicle 100 is in the critical status, the critical status determination unit F108 generates a target route for avoiding the critical situations.

<<First Vehicle Model>>

The first vehicle model F109 is a 6 DoF vehicle model indicating the motion on six axes of the vehicle 100. The 6 DoF vehicle model is obtained by modeling acceleration along three axes, namely, in the "forward/backward (surge)", "left/right (sway)", and "up/down (heave)" directions of the traveling vehicle 100, and the angular velocity along the three axes, namely, "pitch", "roll", and "yaw." That is, the first vehicle model F109 is a numerical model not grasping the motion of the vehicle 100 only on the plane (the forward/backward and left/right directions (i.e., the movement along the X-Y plane) and the yawing (along the Z-axis)) according to the classical vehicle motion engineering, but reproducing the behavior of the vehicle 100 using six axes in total. The six axes further include the pitching (along the Y-axis), rolling (along the X-axis) and the movement along the Z-axis (i.e., the up/down motion) of the vehicle body mounted on the four wheels with the suspension interposed therebetween. The first vehicle model F109 is generated based on the basic motion function of the vehicle 100 set in advance, the external environment of the vehicle 100, and the like. The first vehicle model F109 is updated as appropriate in accordance with changes in the external environment of the vehicle 100, and the like. The first vehicle model F109 is a learning model generated by deep learning, for example.

<<Second Vehicle Model>>

The second vehicle model F110 indicates the energy consumption of the vehicle. Specifically, the second vehicle model F110 indicates cost (fuel consumption or electricity consumption) for the operation of the actuator AC of the vehicle 100. The second vehicle model F110 is obtained by modeling the opening/closing timing of intake/exhaust valves (not shown), the timing of injectors (not shown) injecting the fuel, the opening/closing timing of the valves for the exhaust gas recirculation system, and the like, for example, at the most improved fuel consumption in outputting a predetermined amount of the engine torque. The second vehicle model F110 is generated during the travel of the vehicle, and is updated as appropriate. The second vehicle model F110 is a learning model generated by deep learning, for example.

<<Route Determination Unit>>

The route determination unit F111 determines the target route of the vehicle 100 based on an output from the driver operation recognition unit F002, an output from the route generation unit F107, and an output from a route generation unit F206 of the safety functional unit F2. Specifically, the route determination unit F111 selects either the travel route generated by the route generation unit F107 or a travel route generated by the route generation unit F206 of the safety functional unit F2 as the target route. The route determination unit F111 may adjust the selected target route in accordance with the output from the driver operation recognition unit F002.

The route determination unit F111 may preferentially select the travel route generated by the route generation unit F107 during normal traveling as the target route, for example. The route determination unit F111 may select the travel route generated by the route generation unit F206 of the safety functional unit F2 as the target route when the travel route generated by the route generation unit F107 does not pass through free space searched for by a free space search unit F205 of the safety functional unit F2.

<<Target Motion Determination Unit>>

The target motion determination unit F112 determines the target motion of the vehicle 100 based on an output from the critical status determination unit F108, the first vehicle model F109, and an output from the route determination unit F111. The target motion determination unit F112 may, upon input of the target route generated by the critical status determination unit F108 (the target route for avoiding critical situations), determine the target motion of the vehicle 100 based on the target route generated by the critical status determination unit F108 and the first vehicle model F109, for example. The target motion determination unit F112 may, when the target route generated by the critical status determination unit F108 is not input (the vehicle 100 is not in a critical status), determine the target motion of the vehicle 100 based on the target route generated by the route determination unit F111 and the first vehicle model F109.

<<Vehicle Motion Energy Setting Unit>>

The vehicle motion energy setting unit F113 calculates driving torque required for the drive actuator, steering torque required for the steering actuator, and braking torque required for the braking actuator based on an output from the target motion determination unit F112. Specifically, the vehicle motion energy setting unit F113 calculates the driving torque, the steering torque, and the braking torque such that the motion of the vehicle 100 becomes the target motion determined by the target motion determination unit F112.

<<Energy Management Unit>>

The energy management unit F114 calculates a control amount of the actuator AC based on the second vehicle model F110 and an output from the vehicle motion energy setting unit F113. Specifically, the energy management unit F114 calculates the control amount of the actuator AC based on the second vehicle model F110 at the highest energy efficiency to achieve the target motion determined by the target motion determination unit F112. The energy management unit F114 calculates the opening/closing timing of intake/exhaust valves (not shown), the timing of injectors (not shown) injecting the fuel, and the like at the most improved fuel efficiency to achieve the engine torque determined by the vehicle motion energy setting unit F113.

<<Selector>>

The selector F115 outputs either the output from the vehicle motion energy setting unit F113 or an output from a vehicle motion energy setting unit F310 of the backup functional unit F3. The selector F116 outputs either an output from the energy management unit F114 or an output from an energy management unit F311 of the backup functional unit F3. The output from the selector F115 and the output from the selector F116 are each a control signal for cruise control of the vehicle 100.

Specifically, the selector F115 selects the output from the vehicle motion energy setting unit F113 when no abnormality (e.g., a fault) occurs in the main arithmetic unit F1, and selects the output from the vehicle motion energy setting unit F310 of the backup functional unit F3 when an abnormality occurs in the main arithmetic unit F1. Similarly, the selector F116 selects the output from the energy management unit F114 when no abnormality occurs in the main arithmetic unit F1, and selects the output from the energy management unit F311 of the backup functional unit F3 when an abnormality occurs in the main arithmetic unit F1.

<Safety Functional Unit>

The safety functional unit F2 recognizes the external environment of the vehicle 100 based on the output from the information acquisition unit 10 and searches the external environment of the vehicle 100 for free space. The safety functional unit F2 then generates a travel route passing through the free space. The travel route (the travel route passing through the free space) obtained by the safety functional unit F2 is used in the processing to determine the target route by the main arithmetic unit F1. For the processing by the safety functional unit F2, an algorithm based on a rule set in advance is used in place of the learning model generated by deep learning. In the safety functional unit F2, rule-based processing is performed.

In this example, the safety functional unit F2 includes an object recognition unit F201 (image system), an object recognition unit F202 (radar system), a classification unit F203, the preprocessing unit F204, the free space search unit F205, and the route generation unit F206.

The object recognition unit F201, the object recognition unit F202, the classification unit F203, and the preprocessing unit F204 belong to the recognition block B1. The free space search unit F205 and the route generation unit F206 belong to the determination block B2.

The signal processing unit 201 includes part of the object recognition unit F201 (image system), while the recognition processing unit 202 includes the rest thereof. The determination processing unit 203 (specifically, the control IC unit 33 of the first vehicle control device 25a) includes the object recognition unit F202 (radar system), the classification unit F203, the preprocessing unit F204, the free space search unit F205, and the route generation unit F206.

<<Object Recognition Unit (Image System)>>

The object recognition unit F201 recognizes the object included in the external environment of the vehicle 100 based on the output from the cameras 11. Thus, the object information is obtained. Specifically, the object recognition unit F201 includes an image processing unit and an image recognition unit. The image processing unit performs image processing with respect to the image data which is the output from the cameras 11. The image recognition unit recognizes the object included in the external environment of the vehicle 100 based on the image data processed by the image processing unit. The image recognition unit of the object recognition unit F201 performs object recognition processing using a known pattern recognition technique without using any learning model generated by deep learning, for example. For the object recognition processing by the image recognition unit of the object recognition unit F201, another known object recognition technique (image data-based object recognition technique) may be used.

In this example, the image processing unit of the object recognition unit F201 includes a first image processing unit that performs processing based on an output from the first camera 11a and a second image processing unit that performs processing based on an output from the second camera 11b. The image recognition unit of the object recognition unit F201 includes a first image recognition unit that performs processing based on an output from the first image processing unit and a second image recognition unit that performs processing based on an output from the second image processing unit. In this example, the signal processing unit 201 includes the image processing unit of the object recognition unit F201, while the recognition processing unit 202 includes the image recognition unit of the object recognition unit F201. Specifically, the signal processing IC unit 31 of the first vehicle control device 25a includes the first image processing unit, while the signal processing IC unit 31 of the second vehicle control device 25b includes the second image processing unit. The recognition processing IC unit 32 of the first vehicle control device 25a includes the first image recognition unit, while the recognition processing IC unit 32 of the second vehicle control device 25b includes the second image recognition unit.

<<Object Recognition Unit (Radar System)>>

The object recognition unit F202 recognizes the object included in the external environment of the vehicle 100 based on a detection result which is the output from the radars 12. Thus, the object information is obtained. Specifically, the object recognition unit F202 performs analysis processing with respect to the detection result of the radars 12. The object recognition unit F202 performs object recognition processing using a known object recognition technique (object recognition technique based on the detection result of the radars 12) without using any learning model generated by deep learning, for example.

In this example, the object recognition unit F202 includes a first radar recognition unit that performs processing based on an output from the first radar 12a and a second radar recognition unit that performs processing based on an output from the second radar 12b. In this example, the control IC unit 33 of the first vehicle control device 25a includes the first radar recognition unit and the second radar recognition unit.

<<Classification Unit>>

The classification unit F203 recognizes the external environment of the vehicle 100 based on an output from the object recognition unit F201 (image system) and an output from the object recognition unit F202 (radar system). The classification unit F203 performs recognition processing (rule-based recognition processing) using an algorithm based on a rule set in advance without using any learning model generated by deep learning. For the rule-based recognition processing, a known recognition processing technique may be used. Specifically, the classification unit F203 classifies the object recognized by the object recognition unit F201 and the object recognition unit F202 into a dynamic object and a stationary object. The classification unit F203 fuses the object information obtained by the object recognition unit F201 (image system) and the object information obtained by the object recognition unit F202 (radar system) for each of a plurality of areas (e.g., four areas of front, rear, right, and left) obtained by dividing a surrounding area surrounding the vehicle 100, for example. The classification unit F203 generates classification information of the object included in each of the areas. The classification information indicates that the object corresponds to which of the dynamic object and the stationary object.

<<Preprocessing Unit>>

The preprocessing unit F204 performs preprocessing based on an output from the classification unit F203, the output from the vehicle status detection unit F001 of the main arithmetic unit F1, the output from the position sensor 13, and the output from the external input unit 14. In the preprocessing, classified-information fusion, object behavior prediction, and self-position estimation are performed.

In the classified-information fusion, the preprocessing unit F204 fuses the classification information generated for each of a plurality of areas (e.g., four areas of front, rear, right, and left). The fused classification information is managed on a grid map (not shown) as the classification information on the surrounding area of the vehicle 100.

In the object behavior prediction, the preprocessing unit F204 detects the dynamic object included in the external environment of the vehicle 100 based on the fused classification information. The preprocessing unit F204 predicts changes in the distance between the dynamic object and the vehicle, the direction of the dynamic object with respect to the subject vehicle, and the relative speed of the dynamic object with respect to the vehicle. A result of the prediction by the preprocessing unit F204 is managed as additional information of the dynamic object.

In the self-position estimation, the preprocessing unit F204 estimates the position of the subject vehicle with respect to the object (the dynamic object and the stationary object) included in the external environment of the vehicle 100 based on the position of the vehicle 100 as the output from the position sensor 13, the high-precision map information as an example output from the external input unit 14, and the status of the vehicle 100 (the vehicle speed information, the 6 DoF information, and the like) as the output from the vehicle status detection unit F001.

<<Free Space Search Unit>>

The free space search unit F205 searches the external environment of the vehicle 100 for free space based on the output from the preprocessing unit F204. The free space is an area in which no obstacles are present out of roads included in the external environment of the vehicle 100. The obstacles include a dynamic obstacle and a static obstacle. Examples of the dynamic obstacle include other vehicles and pedestrians. Examples of the static obstacle include median strips, center poles, and the like. The free space may include a space on a road shoulder allowing emergency parking, and the like, for example.

Specifically, the free space search unit F205 searches for the free space that can avoid a collision with the object whose position has been estimated by the preprocessing unit F204. The free space search unit F205 searches for the free space based on a search rule set in advance, for example. The search rule may include a rule that a predetermined range around the object (e.g., a range of a few meters) is set to be an unavoidable range. The free space search unit F205 may, when the object is the dynamic object, search for the free space in consideration of the moving speed of the dynamic object.

<<Route Generation Unit>>

The route generation unit F206 generates the travel route of the vehicle 100 based on an output from the free space search unit F205 and the output from the route search unit F106 of the main arithmetic unit F1 (wide-area route of the vehicle 100). Specifically, the route generation unit F206 generates a travel route passing through the free space obtained by the free space search unit F205. The route generation unit F206 may be configured to generate a plurality of travel routes passing through the free space, and select the one requiring the lowest costs out of the travel routes, for example. The travel route (travel route passing through the free space) generated by the route generation unit F206 is output to the route determination unit F111 of the main arithmetic unit F1.

<Backup Functional Unit>

The backup functional unit F3 recognizes the external environment of the vehicle 100 based on the output from the information acquisition unit 10, searches the external environment of the vehicle 100 for free space, and determines the target route of the vehicle 100 passing through the free space. The backup functional unit F3 then determines the target motion of the vehicle 100 based on the target route of the vehicle 100 and outputs a control signal based on the target motion of the vehicle 100. The control signal obtained by the backup functional unit F3 is supplied to the main arithmetic unit F1. For the processing by the backup functional unit F3, an algorithm based on a rule set in advance is used. In the backup functional unit F3, rule-based processing is performed.

In this example, the backup functional unit F3 includes a vehicle status detection unit F301, a driver operation recognition unit F302, a classification unit F303, a preprocessing unit F304, a free space search unit F305, a route generation unit F306, a critical status determination unit F307, a route determination unit F308, a target motion determination unit F309, a vehicle motion energy setting unit F310, and an energy management unit F311.

The vehicle status detection unit F301, the driver operation recognition unit F302, the classification unit F303, and the preprocessing unit F304 belong to the recognition block B1. The free space search unit F305, the route generation unit F306, the critical status determination unit F307, the route determination unit F308, and the target motion determination unit F309 belong to the determination block B2. The vehicle motion energy setting unit F310 and the energy management unit F311 belong to the operation block B3.

In this example, the backup processing unit 204 (specifically the control IC unit 33 of the second vehicle control device 25b) includes a vehicle status detection unit F301, a driver operation recognition unit F302, a classification unit F303, a preprocessing unit F304, a free space search unit F305, a route generation unit F306, a critical status determination unit F307, a route determination unit F308, a target motion determination unit F309, a vehicle motion energy setting unit F310, and an energy management unit F311.

<<Vehicle Status Detection Unit and Driver Operation Recognition Unit>>

The functions of the vehicle status detection unit F301 and the driver operation recognition unit F302 are the same as the respective functions of the vehicle status detection unit F001 and the driver operation recognition unit F002 of the main arithmetic unit F1.

<<Classification Unit, Preprocessing Unit, Free Space Search Unit, and Route Generation Unit>>

The functions of the classification unit F303, the preprocessing unit F304, the free space search unit F305, and the route generation unit F306 are the same as the respective functions of the classification unit F203, the preprocessing unit F204, the free space search unit F205, and the route generation unit F206 of the safety functional unit F2.

In the example in FIG. 6, the classification unit F303 performs processing based on the output from the object recognition unit F201 (image system) and the output from the object recognition unit F202 (radar system) of the safety functional unit F2. The backup functional unit F3 may include an object recognition unit (image system) and an object recognition unit (radar system) which is the same as the object recognition unit F201 (image system) and the object recognition unit F202 (radar system) of the safety functional unit F2, respectively. In this case, the classification unit F303 may perform the processing based on an output from the object recognition unit (the image system) and an output from the object recognition unit (the radar system) of the backup functional unit F3.

<<Route Determination Unit>>

The route determination unit F308 determines the target route of the vehicle 100 based on an output from the driver operation recognition unit F302 and an output from the route generation unit F306 (travel route passing through the free space). The route determination unit F308 selects any one out of a plurality of travel routes generated by the route generation unit F306 as the target route, for example. The route determination unit F308 may adjust the selected target route in accordance with the output from the driver operation recognition unit F302.

<Target Motion Determination Unit>

The target motion determination unit F309 determines the target motion of the vehicle 100 based on an output from the critical status determination unit F307 (target route) and an output from the route determination unit F308. Unlike the target motion determination unit F112 of the main arithmetic unit F1, the target motion determination unit F309 determines the target motion of the vehicle 100 using an algorithm based on a rule set in advance without using any learning model generated by deep learning. The target motion determination unit F309 may, upon input of the target route generated by the critical status determination unit F307 (the target route for avoiding critical situations), determine the target motion of the vehicle 100 based on the target route generated by the critical status determination unit F307, for example. The target motion determination unit F309 may, when the target route generated by the critical status determination unit F307 is not input (the vehicle 100 is not in a critical status), determine the target motion of the vehicle 100 based on the target route generated by the route determination unit F308.

<<Vehicle Motion Energy Setting Unit>>

Like the vehicle motion energy setting unit F113 of the main arithmetic unit F1, the vehicle motion energy setting unit F310 calculates the driving torque required for the drive actuator, the steering torque required for the steering actuator, and the braking torque required for the braking actuator based on an output from the target motion determination unit F309. Each torque calculated by the vehicle motion energy setting unit F310 is output to the selector F115 of the main arithmetic unit F1.

<Energy Management Unit>

The energy management unit F311 calculates the control amount of the actuator AC based on the output from the vehicle motion energy setting unit F310. Specifically, the energy management unit F311 calculates the control amount of the actuator AC at the highest energy efficiency to achieve the target motion determined by the target motion determination unit F309. Unlike the energy management unit F114 of the main arithmetic unit F1, the energy management unit F311 calculates the control amount of the actuator AC using an algorithm based on a rule set in advance without using any learning model generated by deep learning. The control amount calculated by the energy management unit F311 is output to the selector F116 of the main arithmetic unit F1.

[Single Vehicle Control System]

Figure 7:
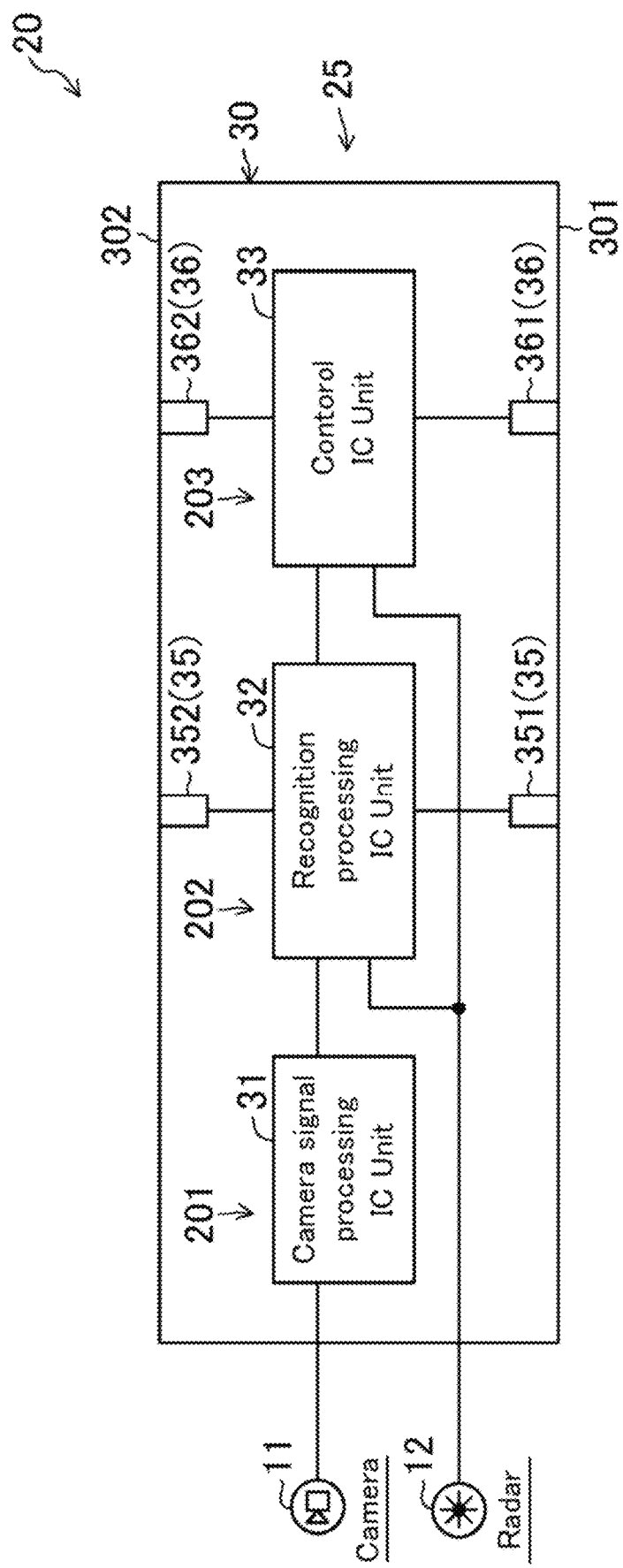
FIG. 7 is a schematic diagram illustrating the configuration of the single vehicle control system according to the embodiment.

FIG. 7 illustrates another configuration of the vehicle control system 20. The vehicle control system 20 illustrated in FIG. 7 is a single vehicle control system. The single vehicle control system is provided with a single processing system (processing system that performs cruise control of the vehicle 100). Specifically, this vehicle control system 20 is constituted by a single vehicle control device 25.

In the vehicle control system 20 illustrated in FIG. 7, the signal processing IC unit 31 of the vehicle control device 25 constitutes the signal processing unit 201. The recognition processing IC unit 32 of the vehicle control device 25 constitutes the recognition processing unit 202. The control IC unit 33 of the vehicle control device 25 constitutes the determination processing unit 203. The vehicle control system 20 illustrated in FIG. 7 is not provided with the backup processing unit 204.

Advantages of Embodiment

As described above, the vehicle control device 25 including the processing IC unit 31, the recognition processing IC unit 32, and the control IC unit 33 constitutes a single vehicle control system 20.

Alternatively, a redundant vehicle control system 20 may be configured by providing a plurality of vehicle control devices 25 in parallel, electrically connecting first terminals 35 of the respective vehicle control devices 25 to each other, and electrically connecting second terminals 36 of the respective vehicle control devices 25 to each other. In this example, the edge portion of the board 30 of the first vehicle control device 25a and the edge portion of the board 30 of the second vehicle control device 25b are connected to the first connection portion 41 and the second connection portion 42 of the connecting member 26, respectively. This connection allows the first terminal 35 of the first vehicle control device 25a and the first terminal 35 of the second vehicle control device 25b to be electrically connected to each other, and allows the second terminal 36 of the first vehicle control device 25a and the second terminal 36 of the second vehicle control device 25b to be electrically connected to each other. This allows the redundant vehicle control system 20 to be constituted.

As described above, the redundant vehicle control system 20 is configured using the vehicle control device 25 that can constitute the single vehicle control system 20. Thus costs required for the development can be reduced compared with the case in which the single vehicle control system and the redundant vehicle control system are separately developed.

First Variation of Embodiment

Figure 8:
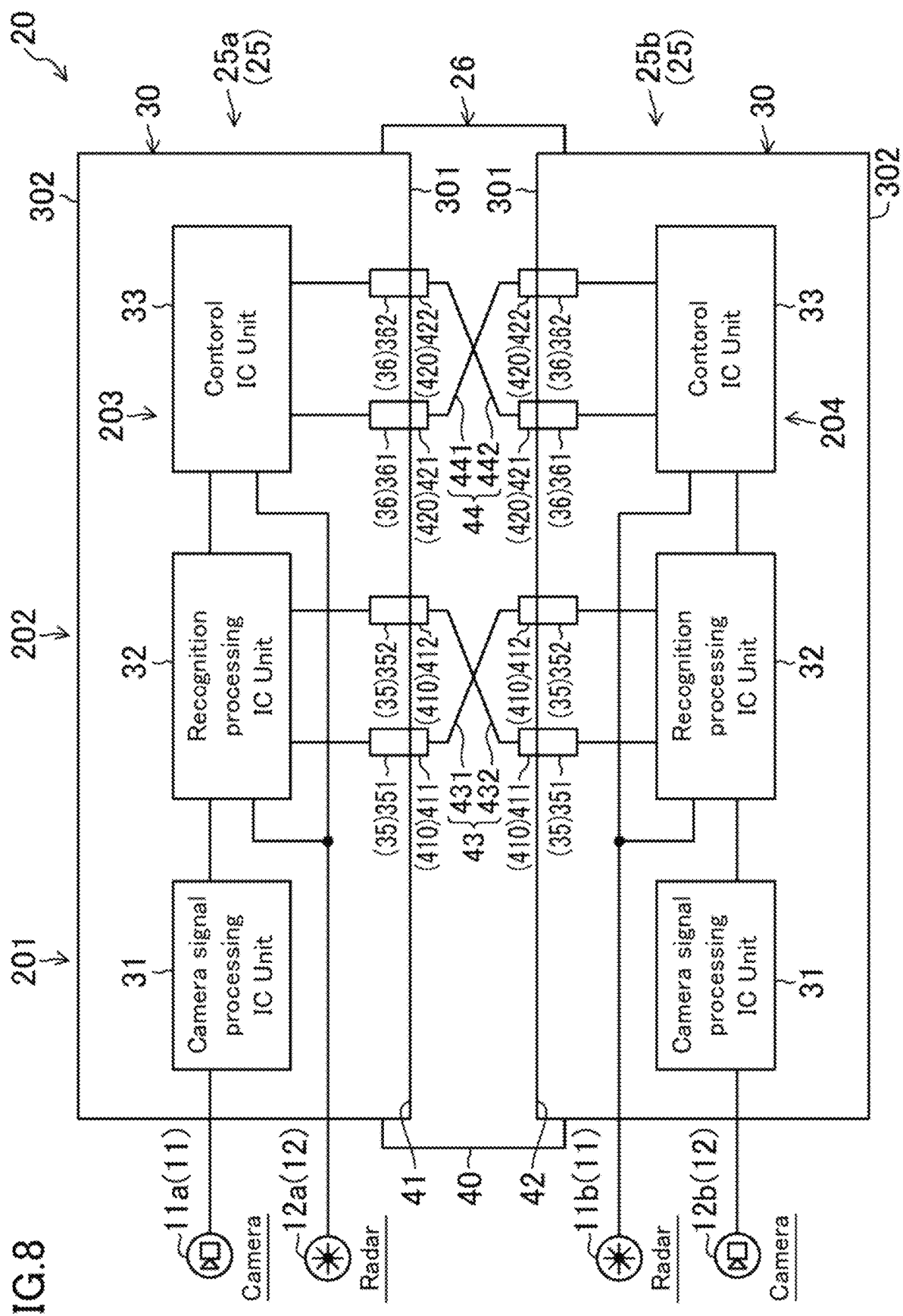
FIG. 8 is a schematic diagram illustrating the configuration of the vehicle control system according to a first variation of the embodiment.
Figure 9:
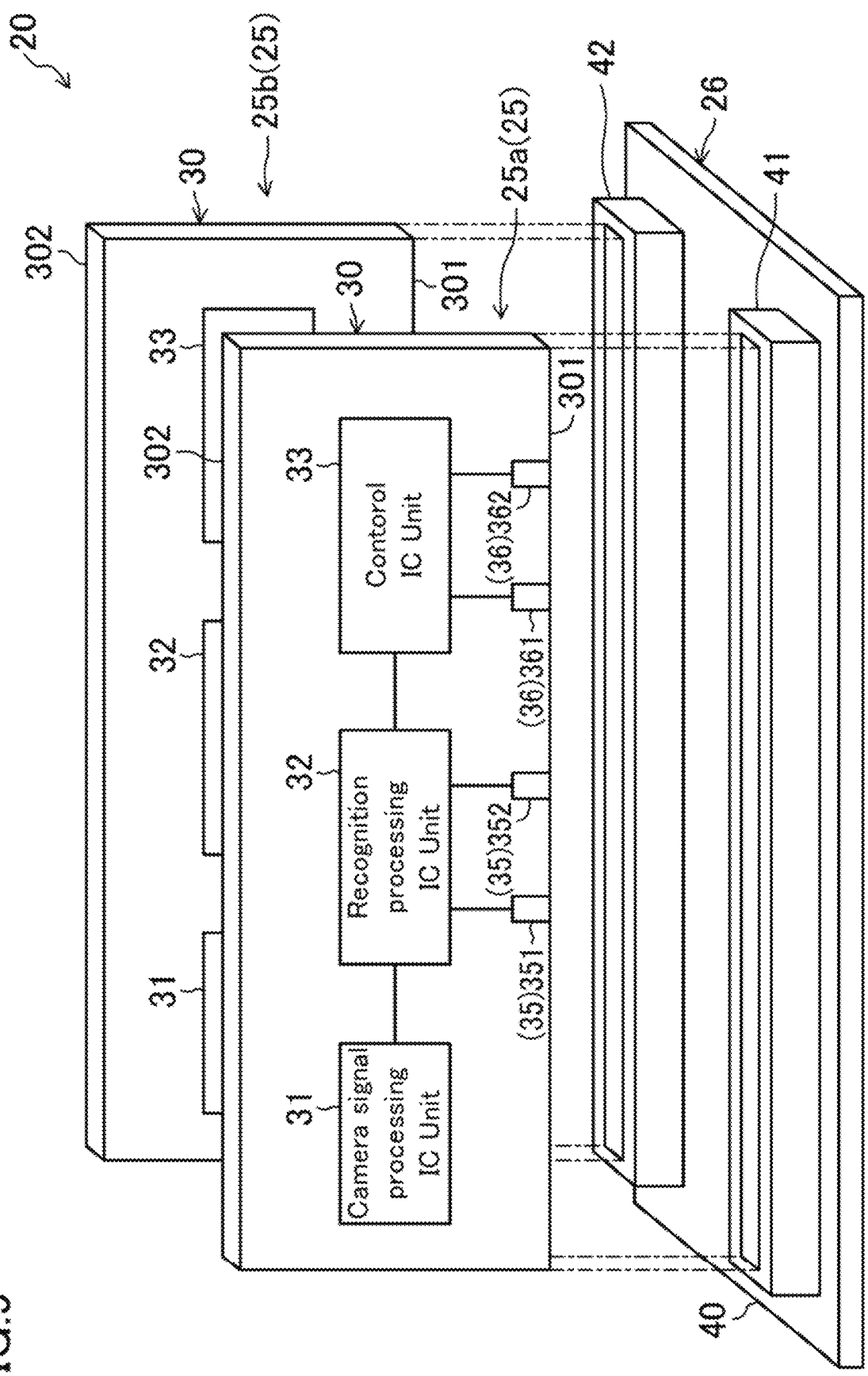
FIG. 9 is a perspective view illustrating the configuration of the vehicle control system according to the first variation of the embodiment.
Figure 10:
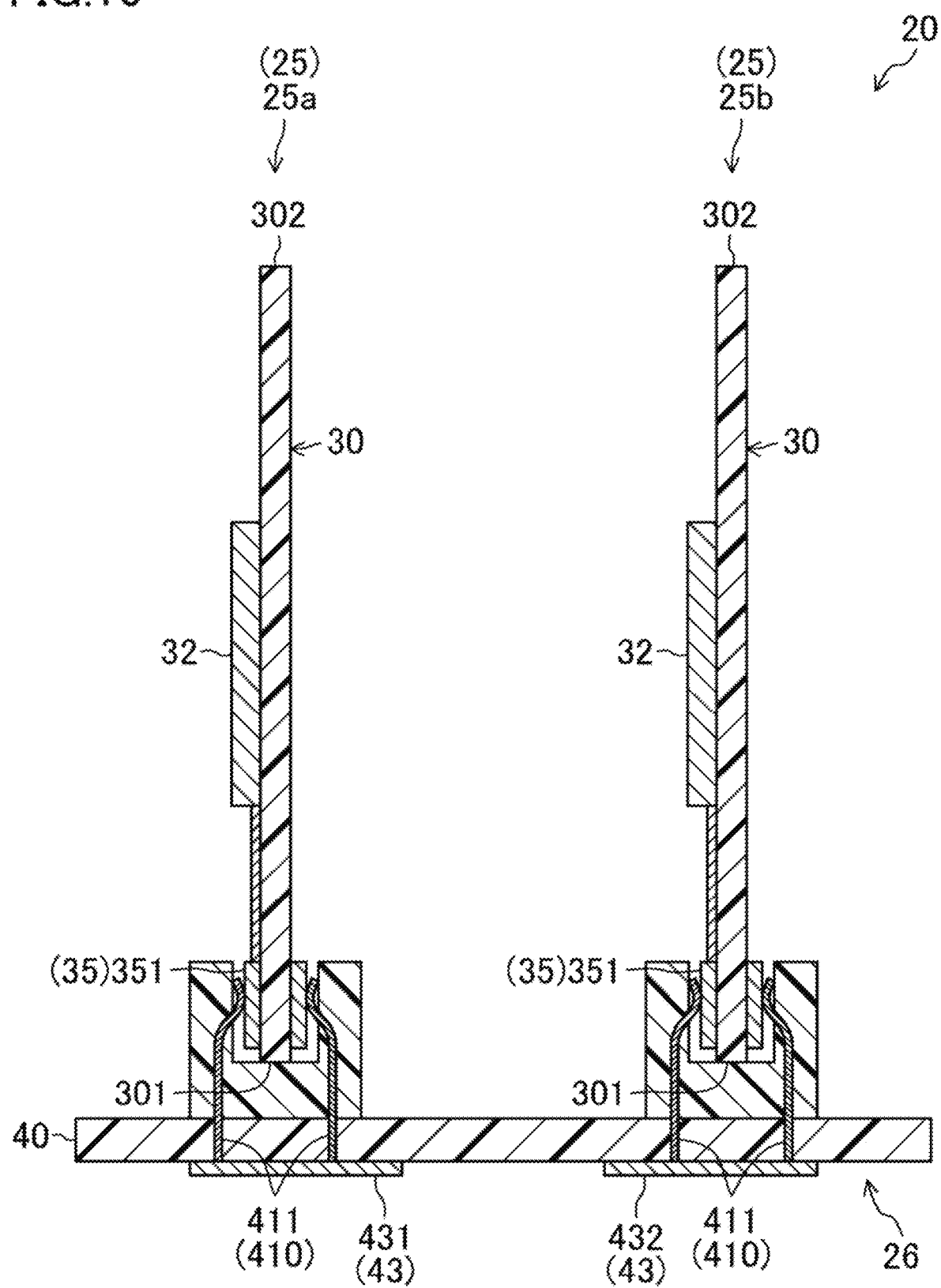
FIG. 10 is a sectional view illustrating the configuration of the vehicle control system according to the first variation of the embodiment.

FIGS. 8, 9, and 10 illustrate a configuration of the vehicle control system 20 according to a first variation of the embodiment.

[Arrangement of Terminals]

In this first variation, the first input terminal 351, the first output terminal 352, the second input terminal 361, and the second output terminal 362 in the vehicle control device 25 are provided on the first edge portion 301 of the board 30.

[Connection Between Vehicle Control Device and Connecting Member]

The first edge portion 301 of the board 30 in the first vehicle control device 25a is connected to the first connection portion 41 of the connecting member 26. The first edge portion 301 of the board 30 in the second vehicle control device 25b is connected to the second connection portion 42 of the connecting member 26.

[Connection Electrode]

The first connection electrode 410 provided in each of the first connection portion 41 and the second connection portion 42 includes a first input connection electrode 411 and a first output connection electrode 412. The second connection electrode 420 provided in each of the first connection portion 41 and the second connection portion 42 includes a second input connection electrode 421 and a second output connection electrode 422.

In this example, when the first edge portion 301 of the board 30 in the first vehicle control device 25a is connected to the first connection portion 41, the first input connection electrode 411 of the first connection portion 41 comes into contact with the first input terminal 351 provided on the first edge portion 301 of the board 30 in the first vehicle control device 25a. The first output connection electrode 412 of the first connection portion 41 comes into contact with the first output terminal 352 provided on the first edge portion 301 of the board 30 in the first vehicle control device 25a. The second input connection electrode 421 of the first connection portion 41 comes into contact with the second input terminal 361 provided on the first edge portion 301 of the board 30 in the first vehicle control device 25a. The second output connection electrode 422 of the first connection portion 41 comes into contact with the second output terminal 362 provided on the first edge portion 301 of the board 30 in the first vehicle control device 25a.

When the first edge portion 301 of the board 30 in the second vehicle control device 25b is connected to the second connection portion 42, the first input connection electrode 411 of the second connection portion 42 comes into contact with the first input terminal 351 provided on the first edge portion 301 of the board 30 in the second vehicle control device 25b. The first output connection electrode 412 of the second connection portion 42 comes into contact with the first output terminal 352 provided on the first edge portion 301 of the board 30 in the second vehicle control device 25b. The second input connection electrode 421 of the second connection portion 42 comes into contact with the second input terminal 361 provided on the first edge portion 301 of the board 30 in the second vehicle control device 25b. The second output connection electrode 422 of the second connection portion 42 comes into contact with the second output terminal 362 provided on the first edge portion 301 of the board 30 in the second vehicle control device 25b.

[First Wiring]

In this example, the first wiring 43 includes a first input/output wiring 431 and a first output/input wiring 432.

The first input/output wiring 431 electrically connects between the first input terminal 351 provided on the first edge portion 301 of the board 30 in the first vehicle control device 25a connected to the first connection portion 41, and the first output terminal 352 provided on the first edge portion 301 of the board 30 in the second vehicle control device 25b connected to the second connection portion 42. In this example, the first input/output wiring 431 electrically connects the first input connection electrode 411 of the first connection portion 41 to the first output connection electrode 412 of the second connection portion 42.

The first output/input wiring 432 electrically connects between the first output terminal 352 provided on the first edge portion 301 of the board 30 in the first vehicle control device 25a connected to the first connection portion 41, and the first input terminal 351 provided on the first edge portion 301 of the board 30 in the second vehicle control device 25b connected to the second connection portion 42. In this example, the first output/input wiring 432 electrically connects between the first output connection electrode 412 of the first connection portion 41 and the first input connection electrode 411 of the second connection portion 42.

[Second Wiring]

In this example, the second wiring 44 includes a second input/output wiring 441 and a second output/input wiring 442.

The second input/output wiring 441 electrically connects between the second input terminal 361 provided on the first edge portion 301 of the board 30 in the first vehicle control device 25a connected to the first connection portion 41, and the second output terminal 362 provided on the first edge portion 301 of the board 30 in the second vehicle control device 25b connected to the second connection portion 42. In this example, the second input/output wiring 441 electrically connects between the second input connection electrode 421 of the first connection portion 41 and the second output connection electrode 422 of the second connection portion 42.

The second output/input wiring 442 electrically connects between the second output terminal 362 provided on the first edge portion 301 of the board 30 in the first vehicle control device 25a connected to the first connection portion 41, and the second input terminal 361 provided on the first edge portion 301 of the board 30 in the second vehicle control device 25b connected to the second connection portion 42. In this example, the second output/input wiring 442 electrically connects between the second output connection electrode 422 of the first connection portion 41 and the second input connection electrode 421 of the second connection portion 42.

[Other Configuration]

The other configuration of the vehicle control system 20 according to the first variation of the embodiment is the same as the configuration of the vehicle control system 20 according to the embodiment.

Advantages of First Variation of Embodiment

The vehicle control system 20 according to the first variation of the embodiment exhibits the same advantages as those exhibited by the vehicle control system 20 according to the embodiment.

Second Variation of Embodiment

FIG. 11 illustrates a configuration of the vehicle control system 20 according to a second variation of the embodiment. In this vehicle control system 20, the recognition processing IC unit 32 of the first vehicle control device 25a and the recognition processing IC unit 32 of the second vehicle control device 25b are communicated with each other (transmit bidirectional signals) through the first wiring 43. Similarly, the control IC unit 33 of the first vehicle control device 25a and the control IC unit 33 of the second vehicle control device 25b are communicated with each other (transmit bidirectional signal) through the second wiring 44.

[Terminal]

In this example, the first terminal 35 and the second terminal 36 are provided on the first edge portion 301 of the board 30. The first terminal 35 is electrically connected to an input/output unit of the recognition processing IC unit 32. The second terminal 36 is electrically connected to an input/output unit of the control IC unit 33.

[Connection Between Vehicle Control Device and Connecting Member]

The first edge portion 301 of the board 30 in the first vehicle control device 25a is connected to the first connection portion 41 of the connecting member 26. The first edge portion 301 of the board 30 in the second vehicle control device 25b is connected to the second connection portion 42 of the connecting member 26.

[Connection Electrode]

In this example, when the first edge portion 301 of the board 30 in the first vehicle control device 25a is connected to the first connection portion 41, the first connection electrode 410 of the first connection portion 41 comes into contact with the first terminal 35 provided on the first edge portion 301 of the board 30 in the first vehicle control device 25a. The second connection electrode 420 of the first connection portion 41 comes into contact with the second terminal 36 provided on the first edge portion 301 of the board 30 in the first vehicle control device 25a.

When the first edge portion 301 of the board 30 in the second vehicle control device 25b is connected to the second connection portion 42, the first connection electrode 410 of the second connection portion 42 comes into contact with the first terminal 35 provided on the first edge portion 301 of the board 30 in the second vehicle control device 25b. The second connection electrode 420 of the second connection portion 42 comes into contact with the second terminal 36 provided on the first edge portion 301 of the board 30 in the second vehicle control device 25b.

[First Wiring]

In this example, the first wiring 43 electrically connects between the first terminal 35 provided on the first edge portion 301 of the board 30 in the first vehicle control device 25a connected to the first connection portion 41, and the first terminal 35 provided on the first edge portion 301 of the board 30 in the second vehicle control device 25b connected to the second connection portion 42. Specifically, the first wiring 43 electrically connects between the first connection electrode 410 of the first connection portion 41 and the first connection electrode 410 of the second connection portion 42.

[Second Wiring]

In this example, the second wiring 44 electrically connects between the second terminal 36 provided on the first edge portion 301 of the board 30 in the first vehicle control device 25*a* connected to the first connection portion 41, and the second terminal 36 provided on the first edge portion 301 of the board 30 in the second vehicle control device 25*b* connected to the second connection portion 42. Specifically, the second wiring 44 electrically connects between the second connection electrode 420 of the first connection portion 41 and the second connection electrode 420 of the second connection portion 42.

[Other Configuration]

The other configuration of the vehicle control system 20 according to the second variation of the embodiment is the same as the configuration of the vehicle control system 20 according to the first variation of the embodiment.

Advantages of Second Variation of Embodiment

The vehicle control system 20 according to the second variation of the embodiment exhibits the same advantages as those exhibited by the vehicle control system 20 according to the embodiment.

Other Embodiments

The foregoing embodiments may be performed in combination as appropriate. The foregoing embodiments are merely exemplary ones in nature, and are not intended to limit the scope, applications, or use of the present disclosure.

What is claimed is:

1. A vehicle control device for controlling a vehicle, the device comprising:
    a board;
    a signal processing IC unit that performs image processing with respect to an output from a camera provided in the vehicle;
    a recognition processing IC unit that performs recognition processing for recognizing an external environment of the vehicle based on an output from the signal processing IC unit;
    a control IC unit that outputs a control signal for cruise control of the vehicle based on an output from the recognition processing IC unit;
    a first terminal electrically connected to the recognition processing IC unit; and
    a second terminal electrically connected to the control IC unit; wherein
    the signal processing IC unit, the recognition processing IC unit, and the control IC unit are disposed on the board, and the
    first terminal and the second terminal are provided on an edge portion of the board in order to provide a redundant vehicle control.

2. A vehicle control system comprising:
    a first vehicle control device; and
    a second vehicle control device, wherein
    each of the first and second vehicle control devices is the vehicle control device of claim 1,
    the first terminal provided on the edge portion of the board of the first vehicle control device is electrically connected to the first terminal provided on the edge portion of the board of the second vehicle control device,
    the second terminal provided on the edge portion of the board of the first vehicle control device is electrically connected to the second terminal provided on the edge portion of the board of the second vehicle control device in order to provide the redundant vehicle control.

3. The vehicle control system of claim 2, further comprising
    a connecting member for connecting the first vehicle control device to the second vehicle control device, wherein
    the connecting member includes:
    a first connection portion connected to the edge portion of the board of the first vehicle control device;
    a second connection portion connected to the edge portion of the board of the second vehicle control device;
    a first wiring for electrically connecting the first terminal which is provided on the edge portion, of the board of the first vehicle control device, connected to the first connection portion to the first terminal which is provided on the edge portion, of the board of the second vehicle control device, connected to the second connection portion; and
    a second wiring for electrically connecting the second terminal which is provided on the edge portion, of the board of the first vehicle control device, connected to the first connection portion to the second terminal which is provided on the edge portion, of the board of the second vehicle control device, connected to the second connection portion, so as to provide the redundant vehicle control.

* * * * *